(12) United States Patent
Lim

(10) Patent No.: US 9,514,790 B2
(45) Date of Patent: Dec. 6, 2016

(54) DATA TRANSMISSION CIRCUIT

(71) Applicant: SK hynix Inc., Icheon-si, Gyeonggi-do (KR)

(72) Inventor: Sang Oh Lim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/711,045

(22) Filed: May 13, 2015

(65) Prior Publication Data

US 2016/0225417 A1  Aug. 4, 2016

(30) Foreign Application Priority Data

Jan. 30, 2015 (KR) .................. 10-2015-0015401

(51) Int. Cl.
| | |
|---|---|
| G11C 7/10 | (2006.01) |
| G11C 7/08 | (2006.01) |
| G11C 7/12 | (2006.01) |
| G11C 7/22 | (2006.01) |
| G11C 7/18 | (2006.01) |

(52) U.S. Cl.
CPC .............. *G11C 7/1051* (2013.01); *G11C 7/08* (2013.01); *G11C 7/1012* (2013.01); *G11C 7/1048* (2013.01); *G11C 7/12* (2013.01); *G11C 7/18* (2013.01); *G11C 7/22* (2013.01); *G11C 2207/002* (2013.01); *G11C 2207/005* (2013.01); *G11C 2207/2245* (2013.01)

(58) Field of Classification Search
CPC ........... G11C 7/1051; G11C 7/08; G11C 7/22; G11C 7/12

USPC ............... 365/189.05, 230.02, 230.03, 230.08, 365/189.17
See application file for complete search history.

(56) References Cited

U.S. PATENT DOCUMENTS

| | | | |
|---|---|---|---|
| 7,266,022 B2 | 9/2007 | Aoki | |
| 2010/0312999 A1* | 12/2010 | Walker | G06F 9/3877 712/221 |
| 2012/0147666 A1* | 6/2012 | Dubourdieu | G11C 11/22 365/163 |
| 2012/0147686 A1* | 6/2012 | Takayama | G11C 7/12 365/203 |
| 2012/0195133 A1* | 8/2012 | Ko | G11C 29/40 365/189.05 |
| 2013/0322170 A1* | 12/2013 | Goldman | G11C 16/28 365/185.03 |

FOREIGN PATENT DOCUMENTS

KR       1020140048413 A    4/2014

* cited by examiner

*Primary Examiner* — Tha-O H Bui
(74) *Attorney, Agent, or Firm* — William Park & Associates Ltd.

(57) ABSTRACT

A data transmission circuit may include data line groups and pass sections arranged among the data line groups to allow the data line groups to form one line. The data transmission circuit may include an input/output unit configured to be coupled to the data line groups and to process write data to be transmitted to the data line groups or read data transmitted from the data line groups. The data transmission circuit may include a pass control unit configured to selectively enable the pass sections in response to an address for specifying a target data line group of the data line groups.

21 Claims, 17 Drawing Sheets

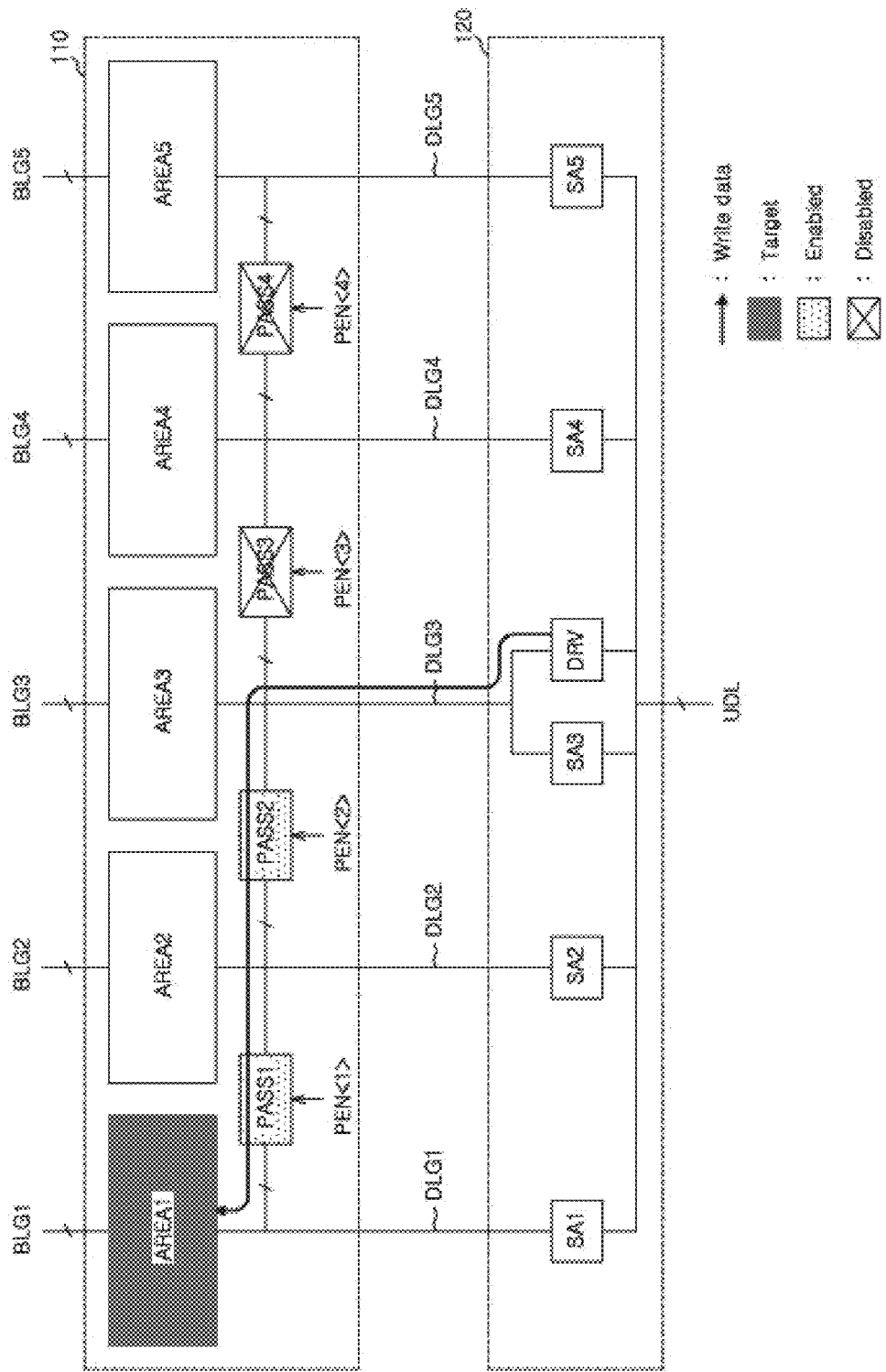

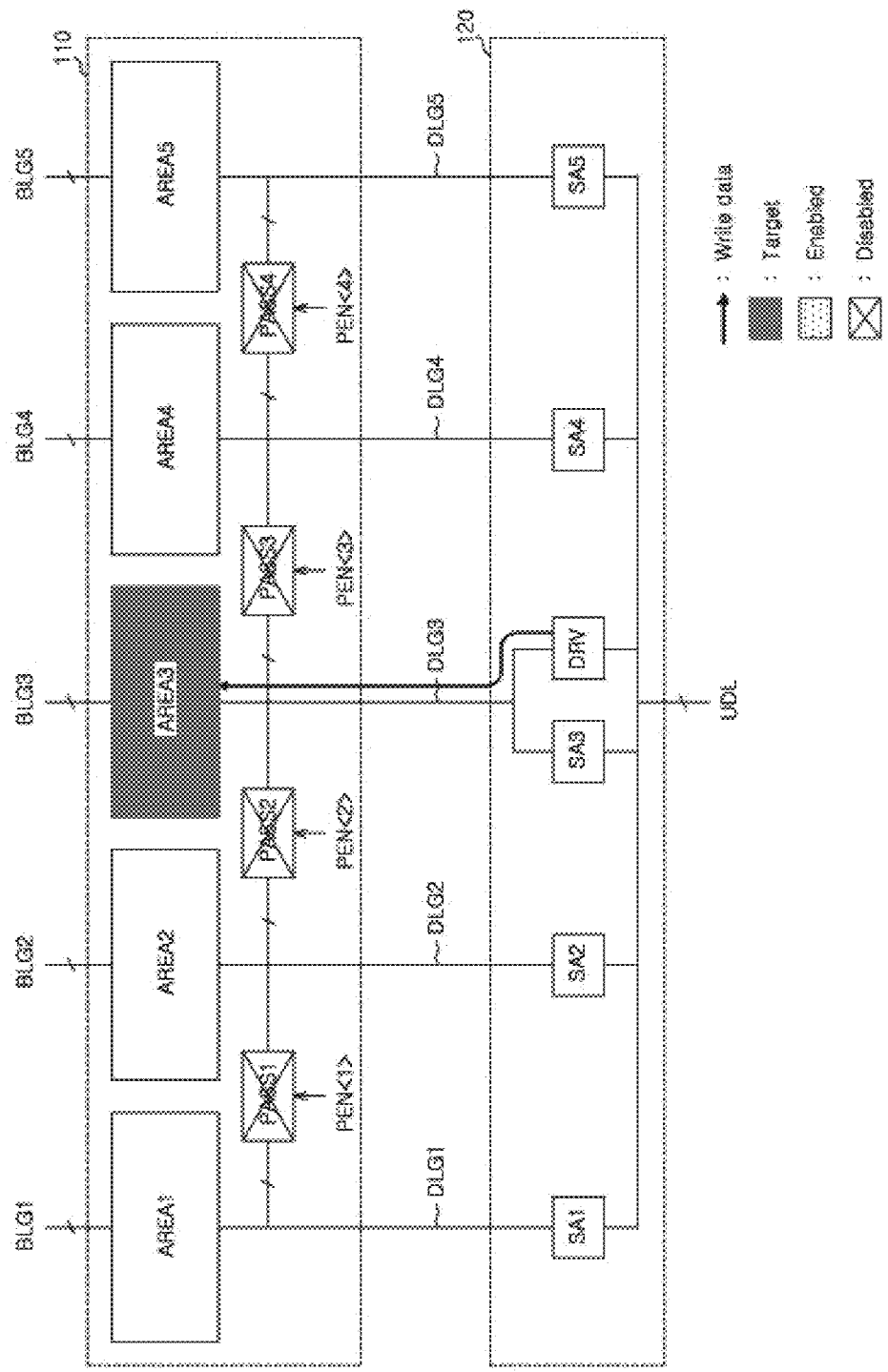

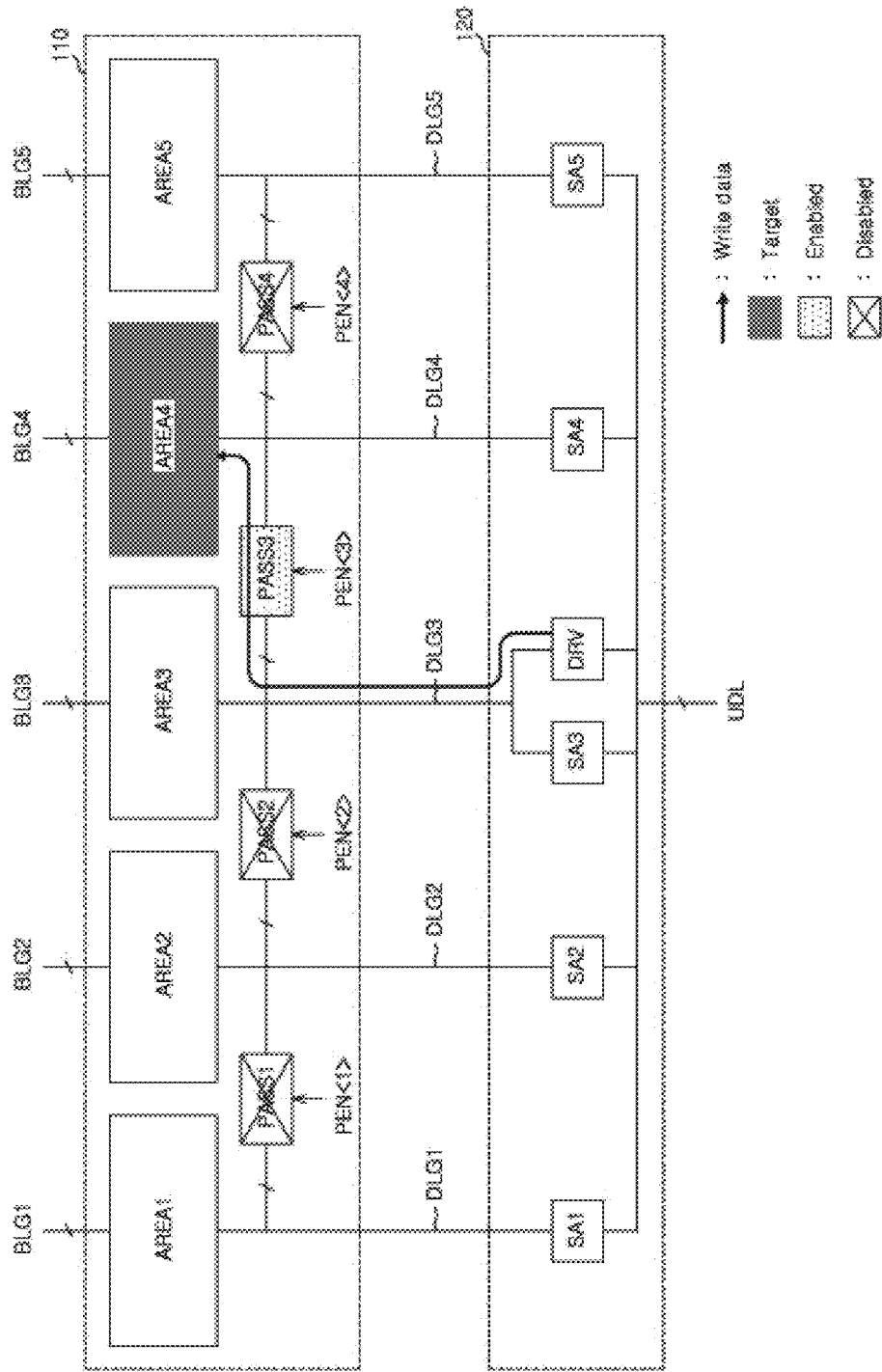

DATA TRANSMISSION CIRCUIT

CROSS-REFERENCES TO RELATED APPLICATION

The present application claims priority under 35 U.S.C. §119(a) to Korean application number 10-2015-0015401, filed on Jan. 30, 2015, in the Korean Intellectual Property Office, which is incorporated herein by reference in its entirety as set forth in full.

BACKGROUND

1. Technical Field

Various embodiments generally relate to a semiconductor apparatus, and more particularly, to a data transmission circuit included by a semiconductor apparatus.

2. Related Art

In order to store data within a semiconductor apparatus, the semiconductor apparatus may use a semiconductor memory apparatus. The semiconductor memory apparatus may be generally classified as a nonvolatile memory apparatus or a volatile memory apparatus.

The nonvolatile memory apparatus may retain stored data even after the power supply to the nonvolatile memory apparatus is cut off. The nonvolatile memory apparatus may include, for example, a flash memory apparatus such as a NAND flash or a NOR flash, FeRAM (Ferroelectrics Random Access Memory), PCRAM (Phase-Change Random Access Memory), MRAM (Magnetic Random Access Memory), ReRAM (Resistive Random Access Memory), and the like.

The volatile memory apparatus may lose stored data when the power supply to the volatile memory apparatus is cut off. The volatile memory apparatus may include, for example, SRAM (Static Random Access Memory), DRAM (Dynamic Random Access Memory), and the like. Since the volatile memory apparatus has a relatively high processing speed, it may be generally used as a buffer memory apparatus, a cache memory apparatus, an operation memory apparatus and the like in a data processing system.

SUMMARY

A data transmission circuit, according to an embodiment, may include data line groups, and pass sections arranged among the data line groups to allow the data line groups to form one line. The data transmission circuit may include an input/output unit configured to be coupled to the data line groups and to process write data to be transmitted to the data line groups or read data transmitted from the data line groups. The data transmission circuit may include a pass control unit configured to selectively enable the pass sections in response to an address for specifying a target data line group of the data line groups.

A data transmission circuit, according to an embodiment, may include data line groups, and pass sections arranged among the data line groups to allow the data line groups to form one line. The data transmission circuit may include buffer areas configured to be respectively coupled to the data line groups, to receive write data from a corresponding data line group, and to transmit read data to the corresponding data line group. The data transmission circuit may include a driver configured to be coupled to a driving data line group of the data line groups, and to transmit write data to be transmitted to a target buffer area of the buffer areas to the driving data line group.

A data transmission circuit, according to an embodiment, may include data line groups, and pass sections arranged among the data line groups to allow the data line groups to form one line. The data transmission circuit may include buffer areas configured to be respectively coupled to the data line groups, to receive write data from a corresponding data line group, and to transmit read data to the corresponding data line group. The data transmission circuit may include sense amplifiers configured to be respectively coupled to the data line groups and to sense and amplify the read data.

BRIEF DESCRIPTION OF THE DRAWINGS

FIG. 6*a* to FIG. 6*e* are examples of diagrams for explaining an operation method of a data transmission circuit for transmitting write data from an input/output unit to a buffer unit.

DETAILED DESCRIPTION

Hereinafter, a data transmission circuit according to various examples of embodiments will be described below with reference to the accompanying drawings.

Figure 1:
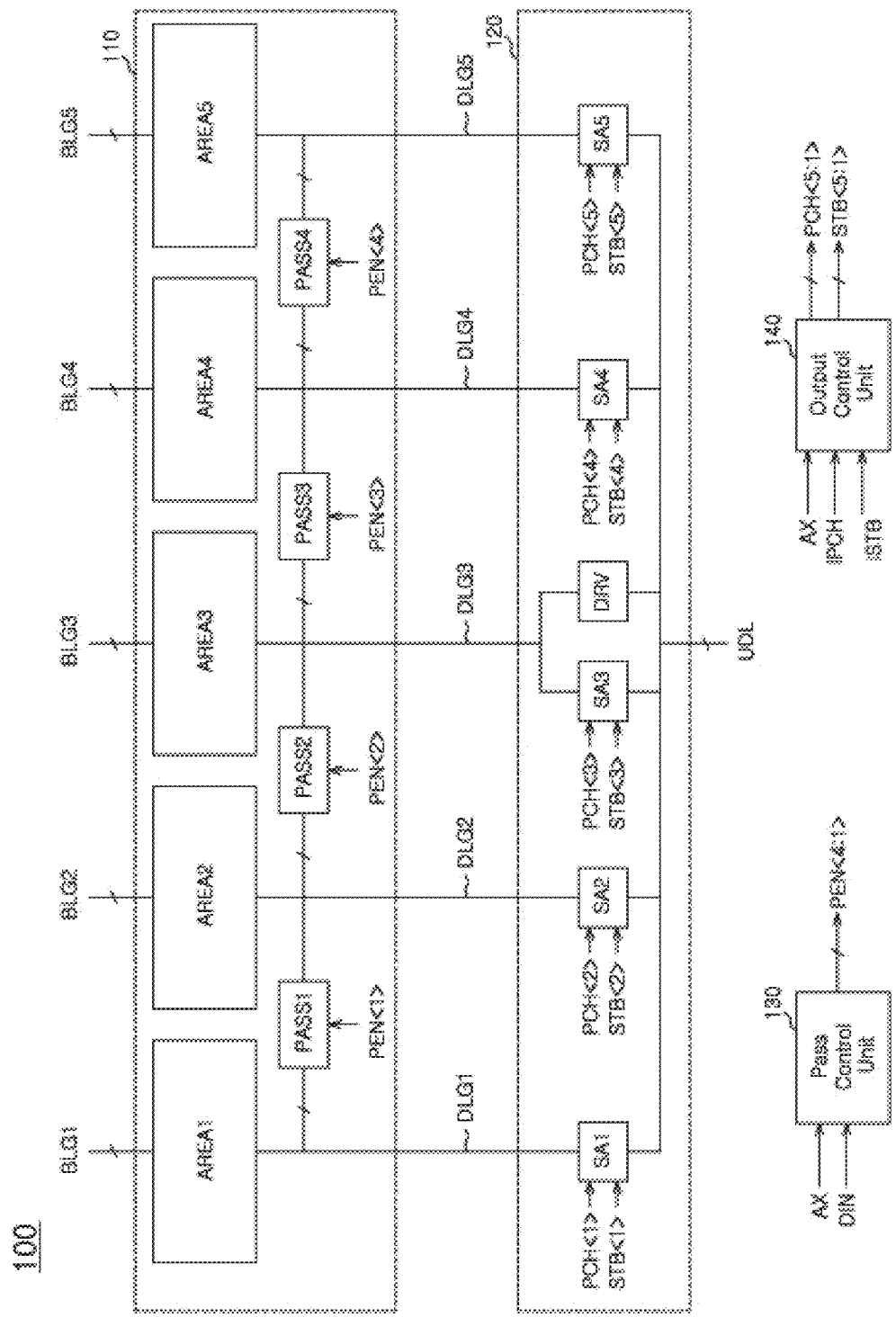
FIG. 1 is a block diagram schematically illustrating a representation of an example of a data transmission circuit according to an embodiment.

Referring to FIG. 1, FIG. 1 is a block diagram schematically illustrating a representation of an example of a data transmission circuit 100 according to an embodiment.

The data transmission circuit 100 may be coupled between an upper data line group UDL and first to fifth bit line groups BLG1 to BLG5. The data transmission circuit 100 may be coupled to a memory block (not illustrated) by the first to fifth bit line groups BLG1 to BLG5. The data transmission circuit 100 may transmit write data from the upper data line group UDL to the first to fifth bit line groups BLG1 to BLG5. The data transmission circuit 100 may transmit read data from the first to fifth bit line groups BLG1 to BLG5 to the upper data line group UDL. The data transmission circuit 100 may include a buffer unit 110, first to fifth data line groups DLG1 to DLG5, and an input/output unit 120. the data transmission circuit may include a pass control unit 130, and an output control unit 140.

The buffer unit 110 may be coupled to the first to fifth bit line groups BLG1 to BLG5. The buffer unit 110 may be coupled to the input/output unit 120 by the first to fifth data line groups DLG1 to DLG5. The buffer unit 110 may transfer the write data from the input/output unit 120 to the first to fifth bit line groups BLG1 to BLG5. The buffer unit 110 may transfer the read data from the first to fifth bit line groups BLG1 to BLG5 to the input/output unit 120. The buffer unit 110 may temporarily store the write data or the read data.

The buffer unit 110 may include first to fifth buffer areas AREA1 to AREA5 and first to fourth pass sections PASS1 to PASS4. The number of the buffer areas and the number of the pass sections included in the buffer unit 110 may vary according to different embodiments. For example, the buffer unit 110 may include N buffer areas and N−1 pass sections (i.e., where N is a natural number).

The first to fifth buffer areas AREA1 to AREA5 may be respectively coupled to the first to fifth bit line groups BLG1 to BLG5. The first to fifth buffer areas AREA1 to AREA5 may be respectively coupled to the first to fifth data line groups DLG1 to DLG5. Each of the first to fifth buffer areas AREA1 to AREA5 may transfer the write data from a corresponding data line group to a corresponding bit line group. Each of the first to fifth buffer areas AREA1 to AREA5 may transfer the read data from the corresponding bit line group to the corresponding data line group.

Each of the first to fifth buffer areas AREA1 to AREA5 may be selected as a target buffer area according to an address inputted to the data transmission circuit 100. For example, the target buffer area may be any one buffer area AREA specified according to the address inputted to the data transmission circuit 100 among the first to fifth buffer areas AREA1 to AREA5. The target buffer area may be a buffer area to which the write data is to be transferred from the input/output unit 120. The target buffer area may be a buffer area which is to transfer the read data to the input/output unit 120. A data line group DLG corresponding to the target buffer area specified according to the address may be defined as a target data line group.

The first to fourth pass sections PASS1 to PASS4 may be arranged among the first to fifth data line groups DLG1 to DLG5 such that the first to fifth data line groups DLG1 to DLG5 form one line. The first to fourth pass sections PASS1 to PASS4 may electrically connect/disconnect two data line groups to/from each other when they are respectively enabled/disabled in response to first to fourth pass signals PEN1 to PEN4. For example, the first pass section PASS1 may be enabled in response to the first pass signal PEN1, thereby electrically connecting the first and second data line groups DLG1 and DLG2 to each other.

The first to fifth data line groups DLG1 to DLG5 may form one line with the first to fourth pass sections PASS1 to PASS4. For example, the first to fifth data line groups DLG1 to DLG5 may form various data transmission paths according to whether each of the first to fourth pass sections PASS1 to PASS4 is enabled.

The input/output unit 120 may be coupled to the upper data line group UDL and may be coupled to the buffer unit 110 by the first to fifth data line groups DLG1 to DLG5. The input/output unit 120 may transfer the write data from the upper data line group UDL to the buffer unit 110. The input/output unit 120 may transfer the read data from the buffer unit 110 to the upper data line group UDL.

The input/output unit 120 may include a driver DRV and first to fifth sense amplifiers SA1 to SA5.

The driver DRV may be coupled to the buffer unit 110 by any one of the first to fifth data line groups DLG1 to DLG5. Among the first to fifth data line groups DLG1 to DLG5, a data line group coupled to the driver DRV may be defined as a driving data line group. For example, the driving data line group may be the third data line group DLG3. The driver DRV may be coupled to the upper data line group UDL, and may transmit write data transmitted from an exterior through the upper data line group UDL to the buffer unit 110 through the third data line group DLG3.

The first to fifth sense amplifiers SA1 to SA5 may be respectively coupled to the first to fifth data line groups DLG1 to DLG5. The first to fifth sense amplifiers SA1 to SA5 may be respectively coupled to the first to fifth buffer areas AREA1 to AREA5 by the first to fifth data line groups DLG1 to DLG5. The first to fifth sense amplifiers SA1 to SA5 may be coupled to the upper data line group UDL. Each of the first to fifth sense amplifiers SA1 to SA5 may amplify read data transmitted from a corresponding buffer area through a corresponding data line group, thereby transmitting the amplified data to an exterior through the upper data line group UDL. The first to fifth sense amplifiers SA1 to SA5 may respectively perform a precharge operation in response to first to fifth precharge signals PCH1 to PCH5. The first to fifth sense amplifiers SA1 to SA5 may respectively perform an amplification operation in response to first to fifth strobe signals STB1 to STB5.

The pass control unit 130 may receive an address AX and a data input signal DIN for specifying the target buffer area among the first to fifth buffer areas AREA1 to AREA5, and output the first to fourth pass signals PEN1 to PEN4. The data input signal DIN may be a signal enabled when the write data is transmitted and disabled when the read data is transmitted.

When the data transmission circuit 100 transmits the write data, the pass control unit 130 may selectively enable the first to fourth pass sections PASS1 to PASS4 through the first to fourth pass signals PEN1 to PEN4 based on the address AX such that the first to fifth data line groups DLG1 to DLG5 form a proper data transmission path from the driver DRV to the target buffer area. Based on the address AX, the pass control unit 130 may enable one or more pass sections, which are arranged between the driving data line group, that is, the third data line group DLG3, and the target data line group, among the first to fourth pass sections PASS1 to PASS4. The pass control unit 130 may disable the other pass sections, except for the one or more pass sections, which are arranged between the third data line group DLG3 and the target data line group, among the first to fourth pass sections PASS1 to PASS4.

When the data transmission circuit 100 transmits the read data, the pass control unit 130 may disable all the first to fourth pass sections PASS1 to PASS4 based on a disabled data input signal DIN in order to disconnect the first to fifth data line groups DLG1 to DLG5 from one another.

The output control unit 140 may receive the address AX, an initial precharge signal IPCH, and an initial strobe signal ISTB. The output control unit 140 may output the first to fifth precharge signals PCH1 to PCH5 and the first to fifth strobe signals STB1 to STB5. The output control unit 140 may control the precharge operations and the amplification operations of the respective first to fifth sense amplifiers SA1 to SA5 through the first to fifth precharge signals PCH1 to PCH5 and the first to fifth strobe signals STB1 to STB5. For example, based on the address AX of the target buffer area, the output control unit 140 may disable a precharge operation and enable an amplification operation with respect to a sense amplifier corresponding to the target buffer area, that is, a sense amplifier coupled to the target data line group. Based on the address AX of the target buffer area, the output control unit 140 may enable a precharge operation with respect to sense amplifiers corresponding to buffer areas except for the target buffer area, that is, sense amplifiers coupled to data line groups except for the target data line group.

According to an embodiment, when the data transmission circuit 100 transmits the write data or the read data, the pass control unit 130 selectively enables the first to fourth pass sections PASS1 to PASS4 or disables all the first to fourth pass sections PASS1 to PASS4, so that a data loading length on the first to fifth data line groups DLG1 to DLG5 may be optimally formed, resulting in the reduction of power consumption and an operation time.

Figure 2:
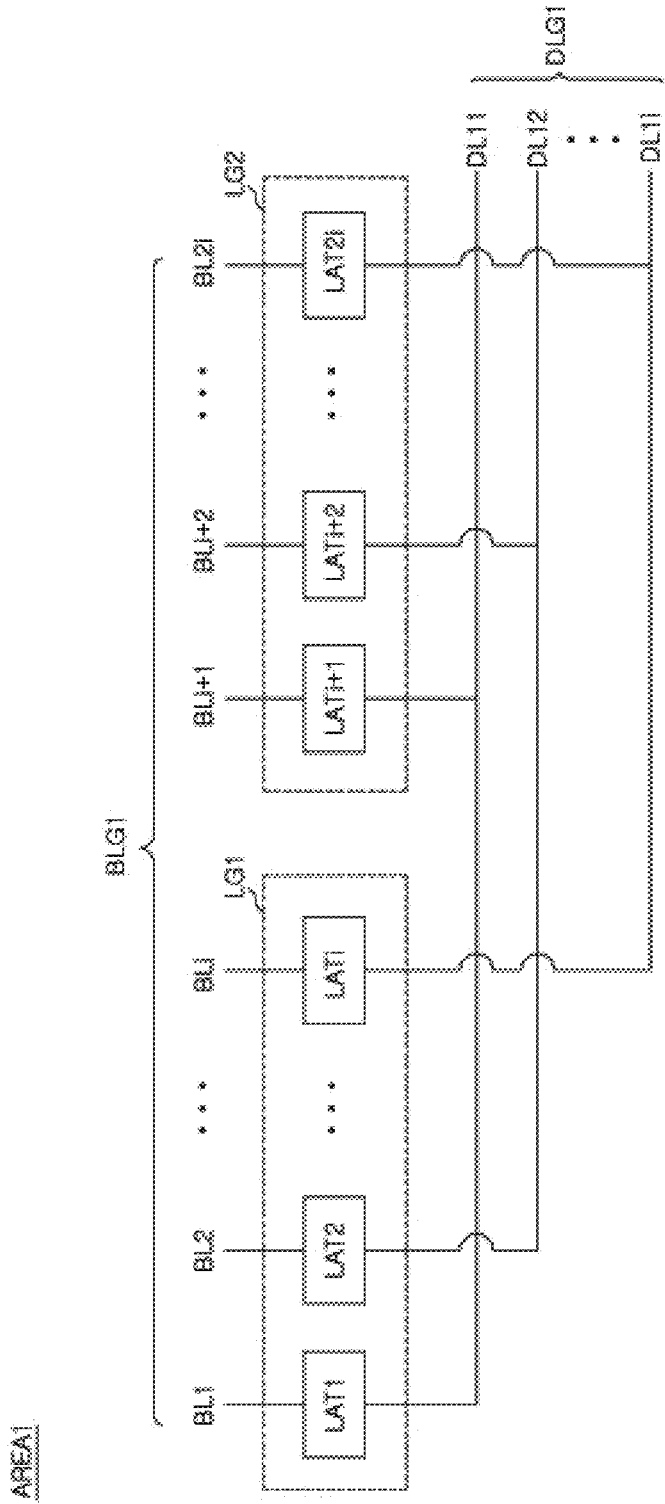
FIG. 2 is a block diagram schematically illustrating a representation of an example of a first buffer area of FIG. 1.

Referring to FIG. 2, FIG. 2 is a block diagram schematically illustrating a representation of an example of the first buffer area AREA1 of FIG. 1. Since the first to fifth buffer areas AREA1 to AREA5 of FIG. 1 may have substantially the same configurations and operations, the first buffer area AREA1 will be described as an example.

The first buffer area AREA1 may include first and second latch groups LG1 and LG2. Latch sections LAT1 to LATi and LATi+1 to LAT2i may be divided in units of latch groups according to a bandwidth of the first data line group DLG1. Referring to FIG. 1, the first buffer area AREA1, for example, includes the two latch groups LG1 and LG2; however, the number of the latch groups included in the first buffer area AREA1 is not limited thereto. The first latch group LG1 and the second latch group LG2 may be controlled in order to receive the write data from the first data line group DLG1 commonly coupled thereto.

The first latch group LG1 may include the latch sections LAT1 to LATi. The latch sections LAT1 to LATi may be respectively coupled to data lines DL11 to DL1i constituting the first data line group DLG1, and may be respectively coupled to bit lines BL1 to BLi. Each of the latch sections LAT1 to LATi may transmit the write data or the read data between a corresponding data line and a corresponding bit line.

The second latch group LG2 may include the latch sections LATi+1 to LAT2i. The latch sections LATi+1 to LAT2i may be respectively coupled to the data lines DL11 to DL1i constituting the first data line group DLG1, and may be respectively coupled to bit lines BLi+1 to BL2i. Each of the latch sections LATi+1 to LAT2i may transmit the write data or the read data between a corresponding data line and a corresponding bit line.

Figure 3:
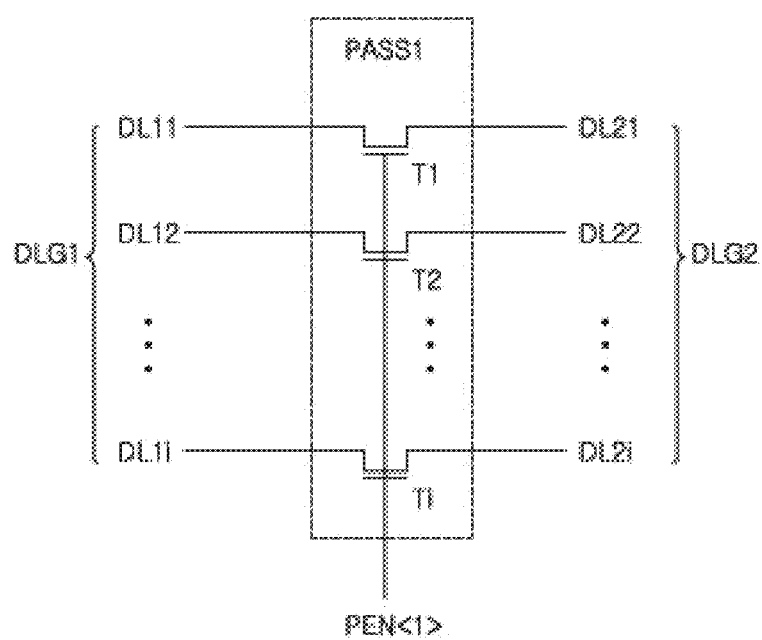
FIG. 3 is a circuit diagram illustrating an example of a configuration of a first pass section of FIG. 1.

Referring to FIG. 3, FIG. 3 is a circuit diagram illustrating an example of a configuration of the first pass section PASS1 of FIG. 1. Since the first to fourth pass sections PASS1 to PASS4 of FIG. 1 may have substantially the same configurations and operations, the first pass section PASS1 will be described as an example.

The first pass section PASS1 may be arranged between the first and second data line groups DLG1 and DLG2. The first pass section PASS1 may be enabled in response to the first pass signal PEN1, thereby electrically connecting the first and second data line groups DLG1 and DLG2 to each other.

The first pass section PASS1 may include transistors T1 to Ti. Each of the transistors T1 to Ti may receive the first pass signal PEN1 through a gate thereof and may be coupled between corresponding data lines of the respective first and second data line groups DLG1 and DLG2. For example, the transistor T1 may be coupled between the data line DL11 of the first data line group DLG1 and the data line DL21 of the second data line group DLG2. Each of the transistors T1 to Ti may be turned on in response to a first pass signal PEN1 enabled to a logic high level, and may electrically connect corresponding data lines to each other. Each of the transistors T1 to Ti may be turned off in response to a first pass signal PEN1 disabled to a logic low level, and may disconnect the corresponding data lines from each other.

Figure 4:
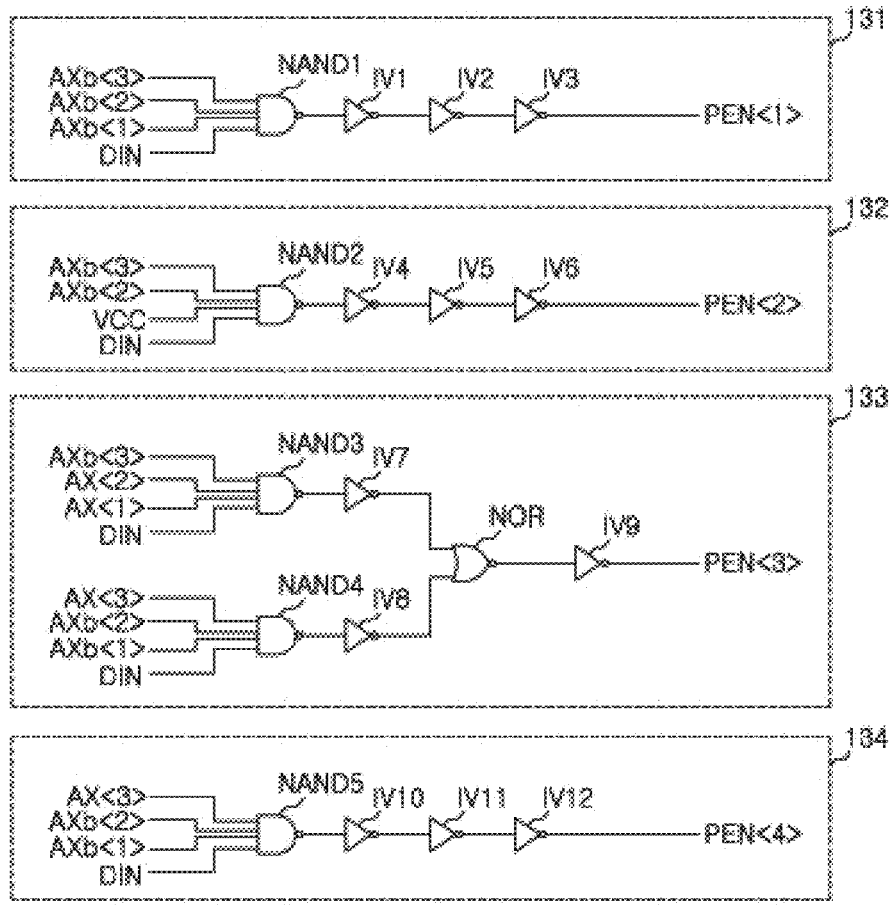
FIG. 4 is a circuit diagram illustrating an example of a configuration of a pass control unit of FIG. 1.
Figure 4:
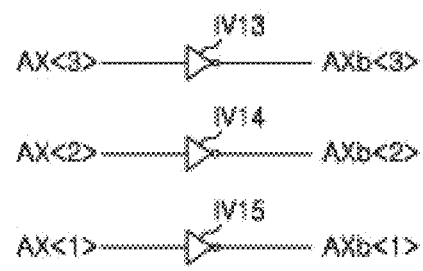

Referring to FIG. 4, FIG. 4 is a circuit diagram illustrating an example of a configuration of the pass control unit 130 of FIG. 1.

Before describing FIG. 4, the following table illustrates an example of an address AX<3:1> respectively corresponding to the first to fifth buffer areas AREA1 to AREA5. The addresses AX for FIG. 1, for example, may include 3 bits.

| Buffer area | AX<3:1> |
|---|---|
| AREA1 | 000 |
| AREA2 | 001 |
| AREA3 | 010 |
| AREA4 | 011 |
| AREA5 | 100 |

As described above, the target buffer area and the target data line group coupled to the target buffer area may be specified among the first to fifth buffer areas AREA1 to AREA5 based on the address AX<3:1> inputted to the data transmission circuit 100. According to the table above, for example, when the address AX<3:1> inputted to the data transmission circuit 100 are 000, the target buffer area may be the first buffer area AREA1.

Referring to FIG. 4, the pass control unit 130 may receive the address AX<3:1> and the data input signal DIN, and output the first to fourth pass signals PEN1 to PEN4. An upper bit AX<3>, an intermediate bit AX<2>, and a lower bit AX<1> of the address may be inverted to an inverted upper bit AXb<3>, an inverted intermediate bit AXb<2>, and an inverted lower bit AXb<1> by inverters IV13 to IV15. The data input signal DIN may be enabled when the write data is transmitted and may be disabled when the read data is transmitted. The pass control unit 130 may include first to fourth lower pass control sections 131 to 134.

The first lower pass control section 131 may include a NAND gate NAND1 and inverters IV1 to IV3. The NAND gate NAND1 may receive the inverted upper bit AXb<3>, the inverted intermediate bit AXb<2>, and the inverted lower bit AXb<1> of the address and the data input signal DIN. Among the three inverters IV1 to IV3 serially coupled to one another, the inverter IV1 may receive the output of the NAND gate NAND1 and the inverter IV3 may output the first pass signal PEN1.

Only when a data input signal DIN enabled to a logic high level and the address AX<3:1> of "000" are inputted, the first lower pass control section 131 may output a first pass signal PEN1 enabled to a logic high level. For example, only when the target buffer area to which the write data is to be transmitted is the first buffer area AREA1, the first lower pass control section 131 may output the enabled first pass signal PEN1.

The second lower pass control section 132 may include a NAND gate NAND2 and inverters IV4 to IV6. The NAND gate NAND2 may receive the inverted upper bit AXb<3> and the inverted intermediate bit AXb<2> of the address, a supply voltage signal VCC of a logic high level, and the data input signal DIN. Among the three inverters IV4 to IV6 serially coupled to one another, the inverter IV4 may receive the output of the NAND gate NAND2 and the inverter IV6 may output the second pass signal PEN2.

Only when the data input signal DIN enabled to the logic high level and the address AX<3:1> of "000" or "001" are inputted, the second lower pass control section 132 may output a second pass signal PEN2 enabled to a logic high level. For example, only when the target buffer area to which the write data is to be transmitted is the first or second buffer area AREA1 or AREA2, the second lower pass control section 132 may output the enabled second pass signal PEN2.

The third lower pass control section 133 may include NAND gates NAND3 and NAND4, inverters IV7 to IV9, and a NOR gate NOR. The NAND gate NAND3 may receive the inverted upper bit AXb<3>, the intermediate bit AX<2>, and the lower bit AX<1> of the address, and the data input signal DIN. The inverter IV7 may receive the output of the NAND gate NAND3. The NAND gate NAND4 may receive the upper bit AX<3>, the inverted intermediate bit AXb<2>, and the inverted lower bit AXb<1> of the address, and the data input signal DIN. The inverter IV8 may receive the output of the NAND gate NAND4. The NOR gate NOR may receive the output of the inverters IV7 and IV8 and perform an NOR operation. The inverter IV9 may receive the output of the NOR gate NOR and output the third pass signal PEN3.

Only when the data input signal DIN enabled to the logic high level and the address AX<3:1> of "011" or "100" are inputted, the third lower pass control section 133 may output a third pass signal PEN3 enabled to a logic high level. For example, only when the target buffer area to which the write data is to be transmitted is the fourth or fifth buffer area AREA4 or AREA5, the third lower pass control section 133 may output the enabled third pass signal PEN3.

The fourth lower pass control section 134 may include a NAND gate NAND5 and inverters IV10 to IV12. The NAND gate NAND5 may receive the upper bit AX<3>, the inverted intermediate bit AXb<2>, and the inverted lower bit AXb<1> of the address, and the data input signal DIN. Among the three inverters IV10 to IV12 serially coupled to one another, the inverter IV10 may receive the output of the NAND gate NAND5 and the inverter IV12 may output the fourth pass signal PEN4.

Only when the data input signal DIN enabled to the logic high level and the address AX<3:1> of "100" are inputted, the fourth lower pass control section 134 may output a fourth pass signal PEN4 enabled to a logic high level. For example, only when the target buffer area to which the write data is to be transmitted is the fifth buffer area AREA5, the fourth lower pass control section 134 may output the enabled fourth pass signal PEN4.

Figure 5:
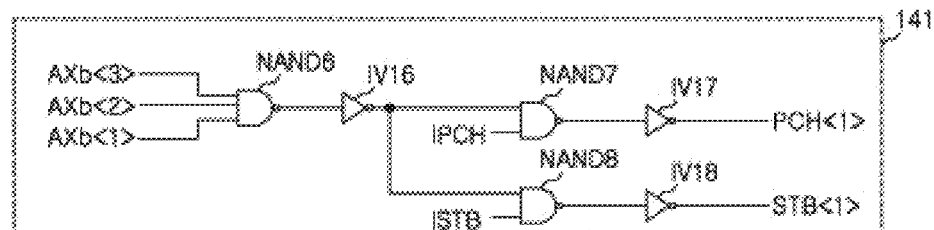
FIG. 5 is a circuit diagram illustrating an example of a configuration of an output control unit of FIG. 1.
Figure 5:
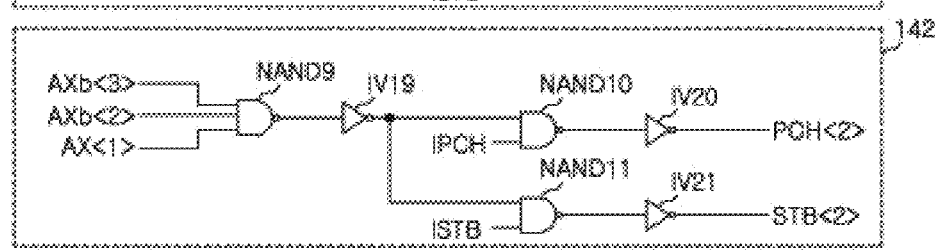
Figure 5:
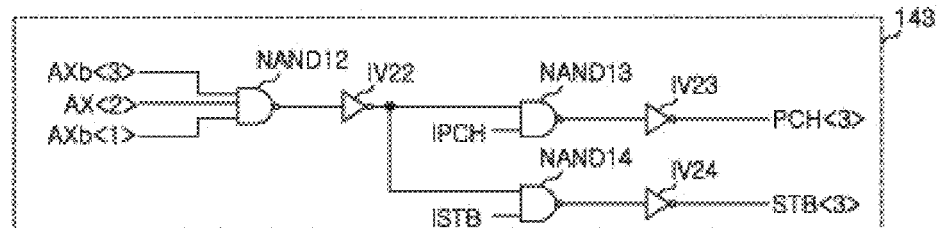
Figure 5:
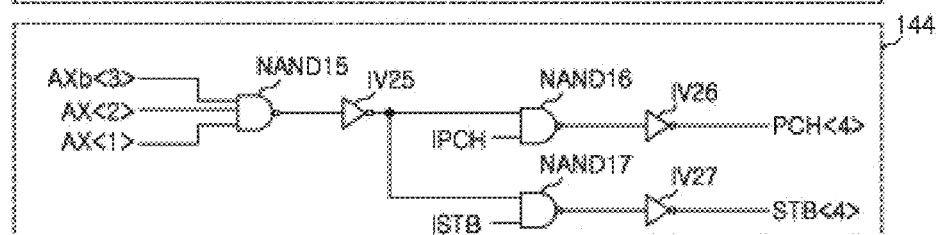
Figure 5:
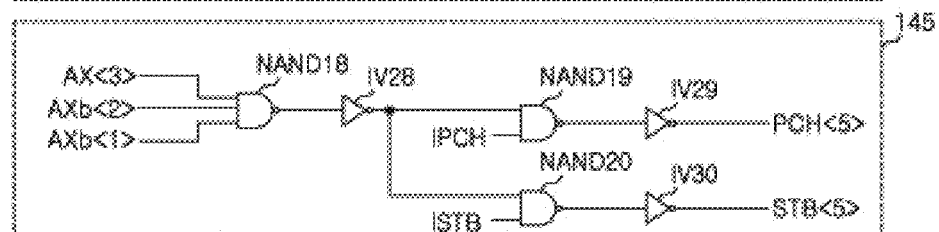

Referring to FIG. 5, FIG. 5 is a circuit diagram illustrating an example of a configuration of the output control unit 140 of FIG. 1.

The output control unit 140 may receive the address AX<3:1>, the initial precharge signal IPCH, and the initial strobe signal ISTB. The output control unit 140 may output the first to fifth precharge signals PCH1 to PCH5 and the first to fifth strobe signals STB1 to STB5. The upper bit AX<3>, the intermediate bit AX<2>, and the lower bit AX<1> of the address may be inverted to an inverted upper bit AXb<3>, an inverted intermediate bit AXb<2>, and an inverted lower bit AXb<1> by inverters IV31 to IV33. The initial precharge signal IPCH may be enabled to a logic low level in order to enable the prechare operation of the sense amplifier. The initial strobe signal ISTB may be enabled to a logic high level in order to enable the amplification operation of the sense amplifier. The output control unit 140 may include first to fifth lower control sections 141 to 145.

The first lower control section 141 may include NAND gates NAND6 to NAND8 and inverters IV16 to IV18. The NAND gate NAND6 may receive the inverted upper bit AXb<3>, the inverted intermediate bit AXb<2>, and the inverted lower bit AXb<1> of the address. The inverter IV16 may receive the output of the NAND gate NAND6. The NAND gate NAND7 may receive the output of the inverter IV16 and the initial precharge signal IPCH. The inverter IV17 may receive the output of the NAND gate NAND7 and output the first precharge signal PCH1. The NAND gate NAND8 may receive the output of the inverter IV16 and the initial strobe signal ISTB. The inverter IV18 may receive the output of the NAND gate NAND8 and output the first strobe signal STB1.

Only when the address AX<3:1> of "000" is inputted, that is, only when the target buffer area is the first buffer area AREA1, the first lower control section 141 may output the initial precharge signal IPCH as the first precharge signal PCH1 and may output the initial strobe signal ISTB as the first strobe signal STB1. When the address AX<3:1> of "000" is not inputted, the first lower control section 141 may output a first precharge signal PCH1 enabled to a logic low level and may output a first strobe signal STB1 disabled to a logic low level.

The second lower control section 142 may include NAND gates NAND9 to NAND11 and inverters IV19 to IV21. The NAND gate NAND9 may receive the inverted upper bit AXb<3>, the inverted intermediate bit AXb<2>, and the lower bit AX<1> of the address. The inverter IV19 may receive the output of the NAND gate NAND9. The NAND gate NAND10 may receive the output of the inverter IV19 and the initial precharge signal IPCH. The inverter IV20 may receive the output of the NAND gate NAND10 and output the second precharge signal PCH2. The NAND gate NAND11 may receive the output of the inverter IV19 and the initial strobe signal ISTB. The inverter IV21 may receive the output of the NAND gate NAND11 and output the second strobe signal STB2.

Only when the address AX<3:1> of "001" is inputted, that is, only when the target buffer area is the second buffer area AREA2, the second lower control section 142 may output the initial precharge signal IPCH as the second precharge signal PCH2 and may output the initial strobe signal ISTB as the second strobe signal STB2. When the address AX<3:1> of "001" is not inputted, the second lower control section 142 may output a second precharge signal PCH2 enabled to a logic low level and may output a second strobe signal STB2 disabled to a logic low level.

The third lower control section 143 may include NAND gates NAND12 to NAND14 and inverters IV22 to IV24. The NAND gate NAND12 may receive the inverted upper bit AXb<3>, the intermediate bit AX<2>, and the inverted lower bit AXb<1> of the address. The inverter IV22 may receive the output of the NAND gate NAND12. The NAND gate NAND13 may receive the output of the inverter IV22 and the initial precharge signal IPCH. The inverter IV23 may receive the output of the NAND gate NAND13 and output the third precharge signal PCH3. The NAND gate NAND14 may receive the output of the inverter IV22 and the initial strobe signal ISTB. The inverter IV24 may receive the output of the NAND gate NAND14 and output the third strobe signal STB3.

Only when the address AX<3:1> of "010" is inputted, that is, only when the target buffer area is the third buffer area AREA3, the third lower control section 143 may output the initial precharge signal IPCH as the third precharge signal PCH3 and may output the initial strobe signal ISTB as the third strobe signal STB3. When the address AX<3:1> of "010" is not inputted, the third lower control section 143 may output a third precharge signal PCH3 enabled to a logic low level and may output a third strobe signal STB3 disabled to a logic low level.

The fourth lower control section 144 may include NAND gates NAND15 to NAND17 and inverters IV25 to IV27. The NAND gate NAND15 may receive the inverted upper bit AXb<3>, the intermediate bit AX<2>, and the lower bit AX<1> of the address. The inverter IV25 may receive the output of the NAND gate NAND15. The NAND gate NAND16 may receive the output of the inverter IV25 and the initial precharge signal IPCH. The inverter IV26 may receive the output of the NAND gate NAND16 and output the fourth precharge signal PCH4. The NAND gate NAND17 may receive the output of the inverter IV25 and the initial strobe signal ISTB. The inverter IV27 may receive the output of the NAND gate NAND17 and output the fourth strobe signal STB4.

Only when the address AX<3:1> of "011" is inputted, that is, only when the target buffer area is the fourth buffer area AREA4, the fourth lower control section 144 may output the initial precharge signal IPCH as the fourth precharge signal PCH4 and may output the initial strobe signal ISTB as the fourth strobe signal STB4. When the address AX<3:1> of "011" is not inputted, the fourth lower control section 144 may output a fourth precharge signal PCH4 enabled to a logic low level and may output a fourth strobe signal STB4 disabled to a logic low level.

The fifth lower control section 145 may include NAND gates NAND18 to NAND20 and inverters IV28 to IV30. The NAND gate NAND18 may receive the upper bit AX<3>, the inverted intermediate bit AXb<2>, and the inverted lower bit AXb<1> of the address. The inverter IV28 may receive the output of the NAND gate NAND18. The NAND gate NAND19 may receive the output of the inverter IV28 and the initial precharge signal IPCH. The inverter IV29 may receive the output of the NAND gate NAND19 and output the fifth precharge signal PCH5. The NAND gate NAND20 may receive the output of the inverter IV28 and the initial strobe signal ISTB. The inverter IV30 may receive the output of the NAND gate NAND20 and output the fifth strobe signal STB5.

Only when the address AX<3:1> of "100" is inputted, that is, only when the target buffer area is the fifth buffer area AREA5, the fifth lower control section 145 may output the initial precharge signal IPCH as the fifth precharge signal PCH5 and may output the initial strobe signal ISTB as the fifth strobe signal STB5. When the address AX<3:1> of "100" is not inputted, the fifth lower control section 145 may output a fifth precharge signal PCH5 enabled to a logic low level and may output a fifth strobe signal STB5 disabled to a logic low level.

FIG. 6a to FIG. 6e are examples of diagrams for explaining an operation method of the data transmission circuit 100 for transmitting the write data from the input/output unit 120 to the buffer unit 110. FIG. 6a to FIG. 6e respectively illustrate data transmission paths formed from the input/output unit 120, that is, the driver DRV, to the target buffer area when the pass control unit 130 controls the first to fourth pass sections PASS1 to PASS4 through the first to fourth pass signals PEN1 to PEN4 according to the address AX.

Hereinafter, with reference to FIG. 1 to FIG. 5 and FIG. 6a to FIG. 6e, the operation method of the data transmission circuit 100 will be described below.

FIG. 6a illustrates an example of a data transmission path when the target buffer area specified by the address AX is the first buffer area AREA1.

The pass control unit 130 may receive the enabled data input signal DIN and the address AX (that is, "000") corresponding to the first buffer area AREA1. In response to the address AX corresponding to the first buffer area AREA1, the first and second lower pass control sections 131 and 132 may output enabled first and second pass signals PEN1 and PEN2 and the third and fourth lower pass control sections 133 and 134 may output disabled third and fourth pass signals PEN3 and PEN4. Consequently, among the first to fourth pass sections PASS1 to PASS4, only the first and second pass sections PASS1 and PASS2 may be enabled. Consequently, the first to third data line groups DLG1 to DLG3 may be electrically connected to one another, thereby forming a data transmission path. The first buffer area AREA1 may be controlled to receive the write data, transmitted from the driver DRV, through the first to third data line groups DLG1 to DLG3.

Figure 6B:
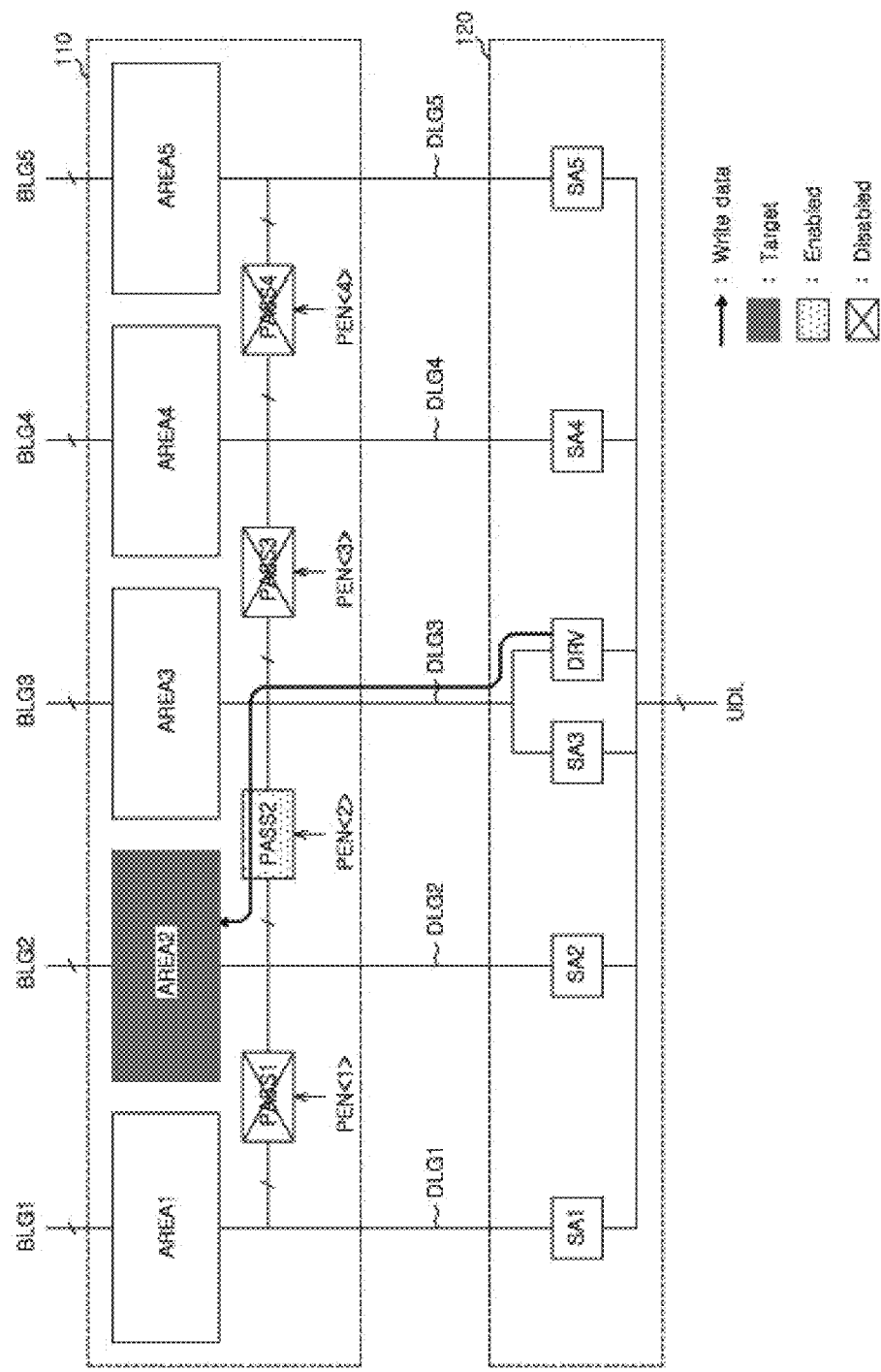

FIG. 6b illustrates an example of a data transmission path when the target buffer area specified by the address AX is the second buffer area AREA2.

The pass control unit 130 may receive the enabled data input signal DIN and the address AX (that is, "001") corresponding to the second buffer area AREA2. In response to the address AX corresponding to the second buffer area AREA2, the second lower pass control section 132 may output an enabled second pass signal PEN2 and the first, third, and fourth lower pass control sections 131, 133, and 134 may output disabled first, third, and fourth pass signals PEN1, PEN3, and PEN4. Consequently, among the first to fourth pass sections PASS1 to PASS4, only the second pass section PASS2 may be enabled. Consequently, the second and third data line groups DLG2 and DLG3 may be electrically connected to one another, thereby forming a data transmission path. The second buffer area AREA2 may be controlled to receive the write data, transmitted from the driver DRV, through the second and third data line groups DLG2 and DLG3.

FIG. 6c illustrates an example of a data transmission path when the target buffer area specified by the address AX is the third buffer area AREA3.

The pass control unit 130 may receive the enabled data input signal DIN and the address AX (that is, "010") corresponding to the third buffer area AREA3. In response to the address AX corresponding to the third buffer area AREA3, the first to fourth lower pass control sections 131 to 134 may output disabled first to fourth pass signals PEN1 to PEN4. Consequently, all the first to fourth pass sections PASS1 to PASS4 may be disabled. Consequently, the first to fifth data line groups DLG1 to DLG5 may be disconnected from one another. The third buffer area AREA3 may be controlled to receive the write data, transmitted from the driver DRV, through the third data line group DLG3.

FIG. 6d illustrates an example of a data transmission path when the target buffer area specified by the address AX is the fourth buffer area AREA4.

The pass control unit 130 may receive the enabled data input signal DIN and the address AX (that is, "011") corresponding to the fourth buffer area AREA4. In response to the address AX corresponding to the fourth buffer area AREA4, the third lower pass control section 133 may output an enabled third pass signal PEN3 and the first, second, and fourth lower pass control sections 131, 132, and 134 may output disabled first, second, and fourth pass signals PEN1, PEN2, and PEN4. Consequently, among the first to fourth pass sections PASS1 to PASS4, only the third pass section PASS3 may be enabled. Consequently, the third and fourth data line groups DLG3 and DLG4 may be electrically connected to one another, thereby forming a data transmission path. The fourth buffer area AREA4 may be controlled to receive the write data, transmitted from the driver DRV, through the third and fourth data line groups DLG3 and DLG4.

Figure 6E:
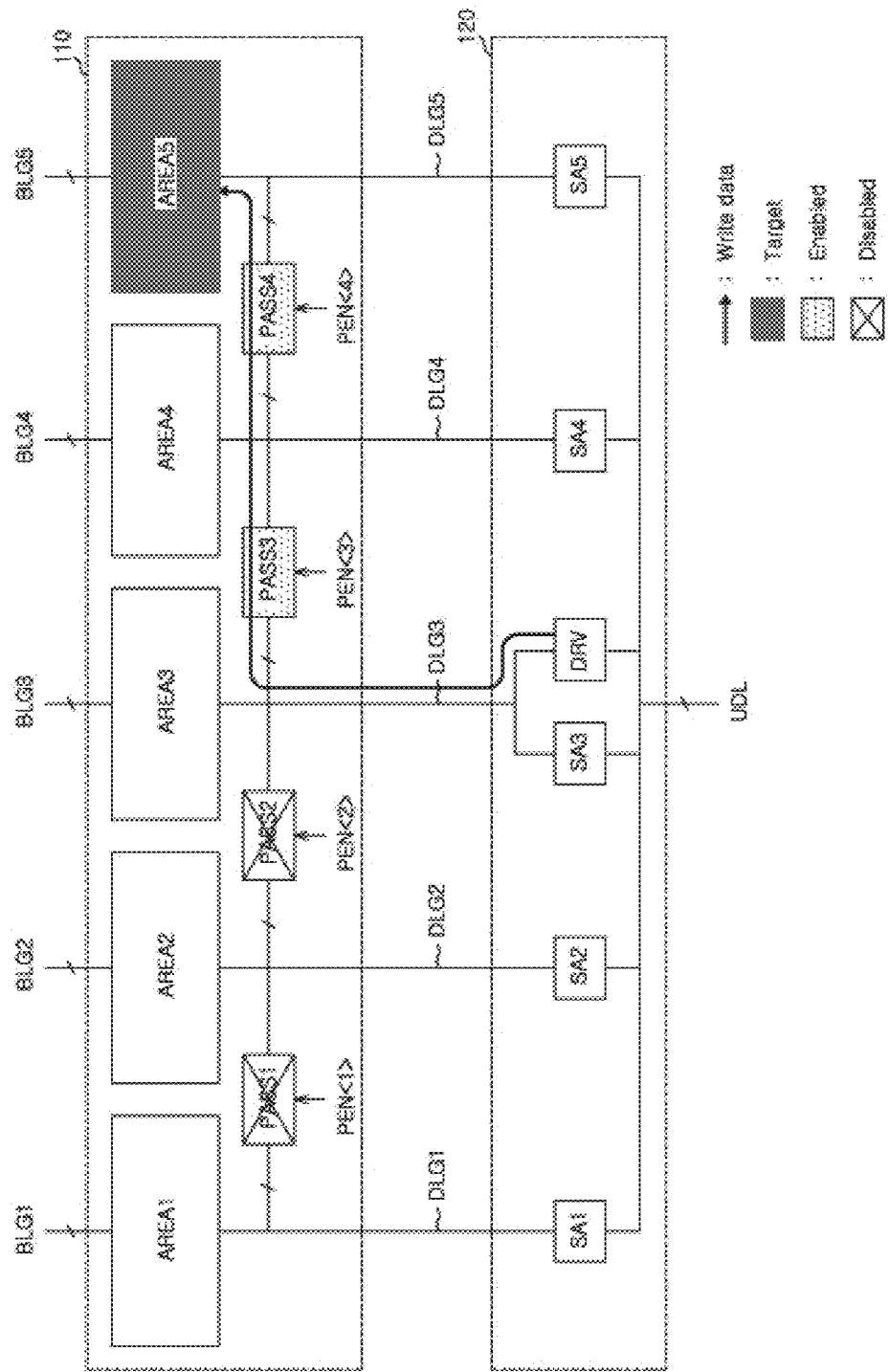

FIG. 6e illustrates an example of a data transmission path when the target buffer area specified by the address AX is the fifth buffer area AREA5.

The pass control unit 130 may receive the enabled data input signal DIN and the address AX (that is, "100") corresponding to the fifth buffer area AREA5. In response to the address AX corresponding to the fifth buffer area AREA5, the third and fourth lower pass control sections 133 and 134 may output enabled third and fourth pass signals PEN3 and PEN4 and the first and second lower pass control sections 131 and 132 may output disabled first and second pass signals PEN1 and PEN2. Consequently, among the first to fourth pass sections PASS1 to PASS4, only the third and fourth pass section PASS3 and PASS4 may be enabled. Consequently, the third to fifth data line groups DLG3 to DLG5 may be electrically connected to one another, thereby forming a data transmission path. The fifth buffer area AREA5 may be controlled to receive the write data, transmitted from the driver DRV, through the third to fifth data line groups DLG3 to DLG5.

Figure 7:
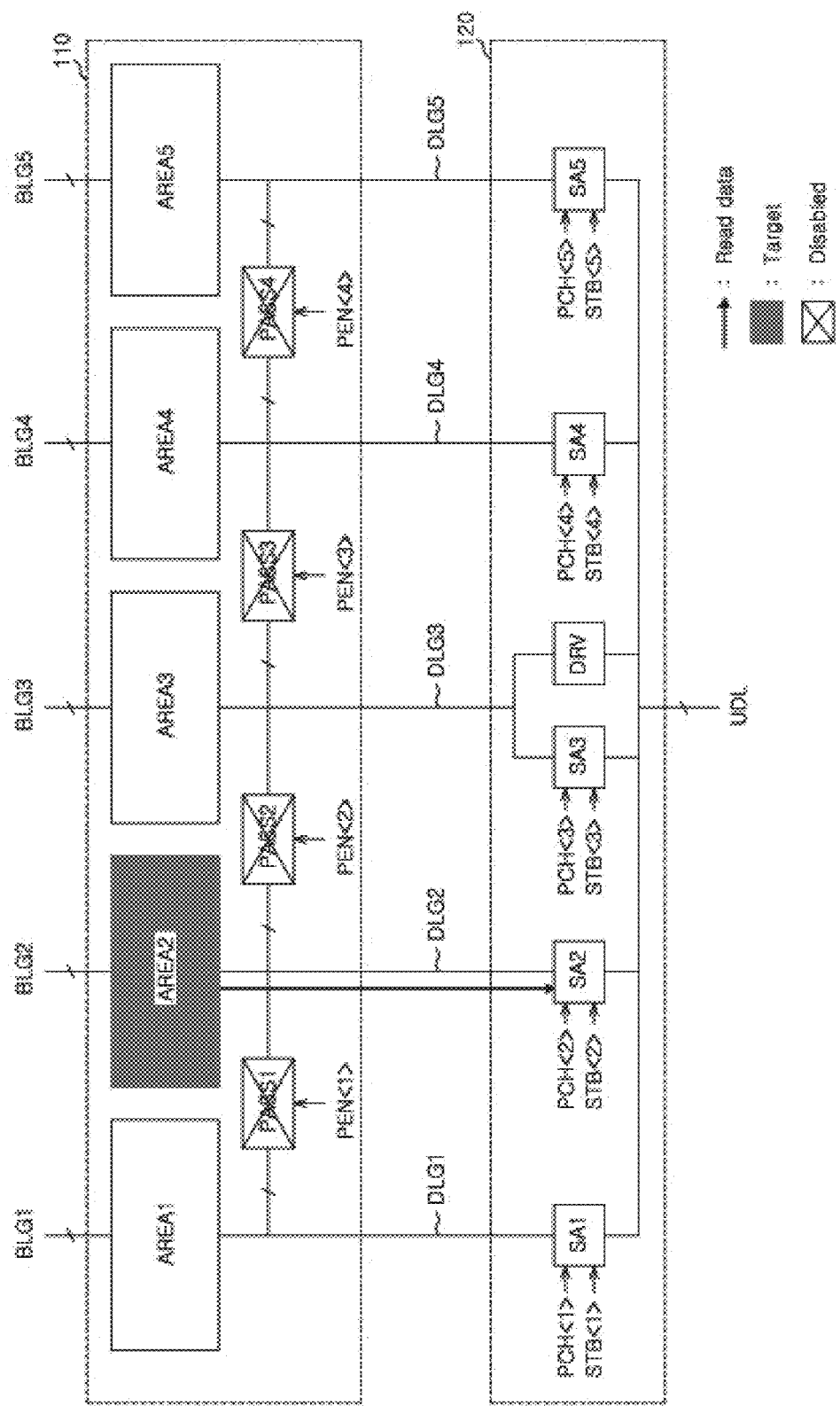
FIG. 7 is an example of a diagram for explaining an operation method of a data transmission circuit for transmitting read data from a buffer unit to an input/output unit.

FIG. 7 is an example of a diagram for explaining an operation method of the data transmission circuit 100 for transmitting the read data from the buffer unit 110 to the input/output unit 120. FIG. 7 illustrates a data transmission path when the target buffer area specified by the address AX, for example, is the second buffer area AREA2.

Hereinafter, with reference to FIG. 1 to FIG. 5 and FIG. 7, an operation method of the data transmission circuit 100 will be described below.

The pass control unit 130 may output the disabled first to fourth pass signals PEN1 to PEN4 in response to the disable data input signal DIN. The first to fourth pass sections PASS1 to PASS4 may be disabled in response to the disabled first to fourth pass signals PEN1 to PEN4, and may disconnect the first to fifth data line groups DLG1 to DLG5 from one another. Consequently, a data transmission path between the target buffer area, that is, the second buffer area AREA2 and the second sense amplifier SA2 may be limited to the second data line group DLG2. The second buffer area AREA2 may transmit the read data, transmitted from the second bit line group BLG2, to the second sense amplifier SA2 through the second data line group DLG2.

The output control unit 140 may output the first to fifth precharge signals PCH1 to PCH5 and the first to fifth strobe signals STB1 to STB5 based on the address AX (that is, "001") of the second buffer area AREA2. The second sense amplifier SA2 may amplify the read data in response to the enabled second strobe signal STB2, and output the amplified data to the upper data line group UDL. The first and third to fifth sense amplifiers SA1 and SA3 to SA5 may substantially maintain precharge states in response to the enabled first and third to fifth precharge signals PCH1 and PCH3 to PCH5.

In an example, although not illustrated in the figure, even when the target buffer area are buffer areas other than the second buffer area AREA2, the data transmission circuit 100 may disconnect the first to fifth data line groups DLG1 to DLG5 from one another, thereby limiting a data transmission path between the target buffer area and a sense amplifier corresponding to the target buffer area to the target data line group.

Figure 8:
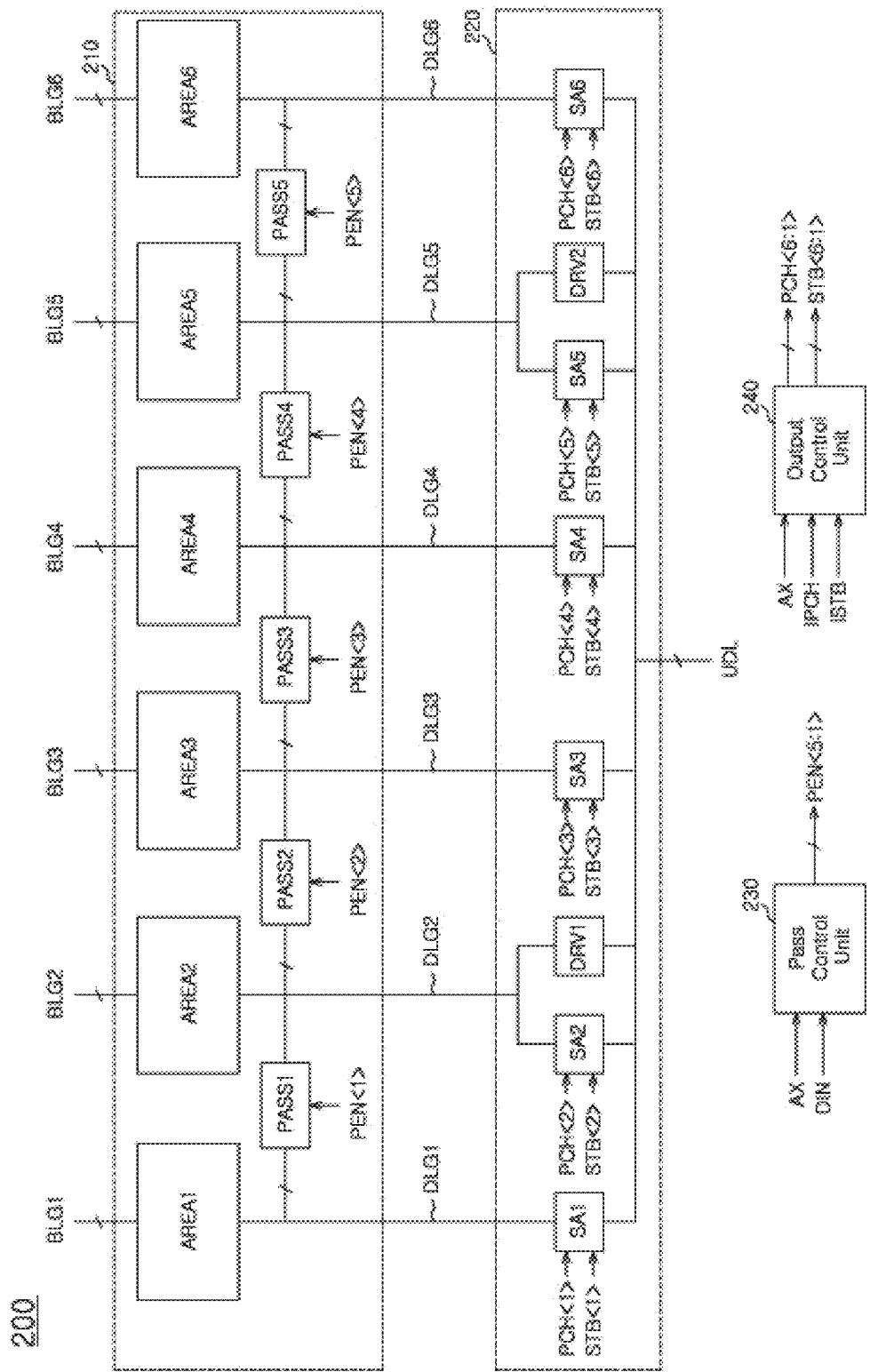
FIG. 8 is a block diagram schematically illustrating a representation of an example of a data transmission circuit according to an embodiment.

Referring to FIG. 8, FIG. 8 is a block diagram schematically illustrating a representation of an example of a data transmission circuit 200 according to an embodiment. The data transmission circuit 200 may have configurations and operations substantially similar to those of the data transmission circuit 100 of FIG. 1, except that two drivers are provided.

The data transmission circuit 200 may include a buffer unit 210, first to sixth data line groups DLG1 to DLG6, and an input/output unit 220. The data transmission circuit 200 may include a pass control unit 230, and an output control unit 240.

The buffer unit 210 may be coupled to first to sixth bit line groups BLG1 to BLG6. The buffer unit 210 may be coupled to the input/output unit 220 through the first to sixth data line groups DLG1 to DLG6. The buffer unit 210 may include first to sixth buffer areas AREA1 to AREA6 and first to fifth pass sections PASS1 to PASS5. The first to sixth buffer areas AREA1 to AREA6 may be respectively coupled to the first to sixth bit line groups BLG1 to BLG6, and may be respectively coupled to the first to sixth data line groups DLG1 to DLG6. The first to fifth pass sections PASS1 to PASS5 may be arranged among the first to sixth data line groups DLG1 to DLG6 such that the first to sixth data line groups DLG1 to DLG6 form one line. The first to sixth data line groups DLG1 to DLG6 may form one line by the first to fifth pass sections PASS1 to PASS5.

The input/output unit 220 may be coupled to the upper data line group UDL and may be coupled to the buffer unit 210 by the first to sixth data line groups DLG1 to DLG6. The input/output unit 220 may include first and second drivers DRV1 and DRV2 and first to sixth sense amplifiers SA1 to SA6.

The first and second drivers DRV1 and DRV2 may be coupled to the buffer unit 210 by two of the first to sixth data line groups DLG1 to DLG6. For example, the first driver DRV1 may be coupled to the second data line group DLG2 and the second driver DRV2 may be coupled to the fifth data line group DLG5. When the target buffer area is any one of the first to third buffer areas AREA1 to AREA3, the first driver DRV1 may transmit the write data to the target buffer area. When the target buffer area is any one of the fourth to sixth buffer areas AREA4 to AREA6, the second driver DRV2 may transmit the write data to the target buffer area.

The pass control unit 230 may receive the address AX and the data input signal DIN for specifying the target buffer area among the first to sixth buffer areas AREA1 to AREA6. The pass control unit 230 may output first to fifth pass signals PEN1 to PEN5. Similarly to the pass control unit 130 of FIG. 1, the pass control unit 230 may selectively enable the first to fifth pass sections PASS1 to PASS5 in order to optimally form a data transmission path.

Figure 9:
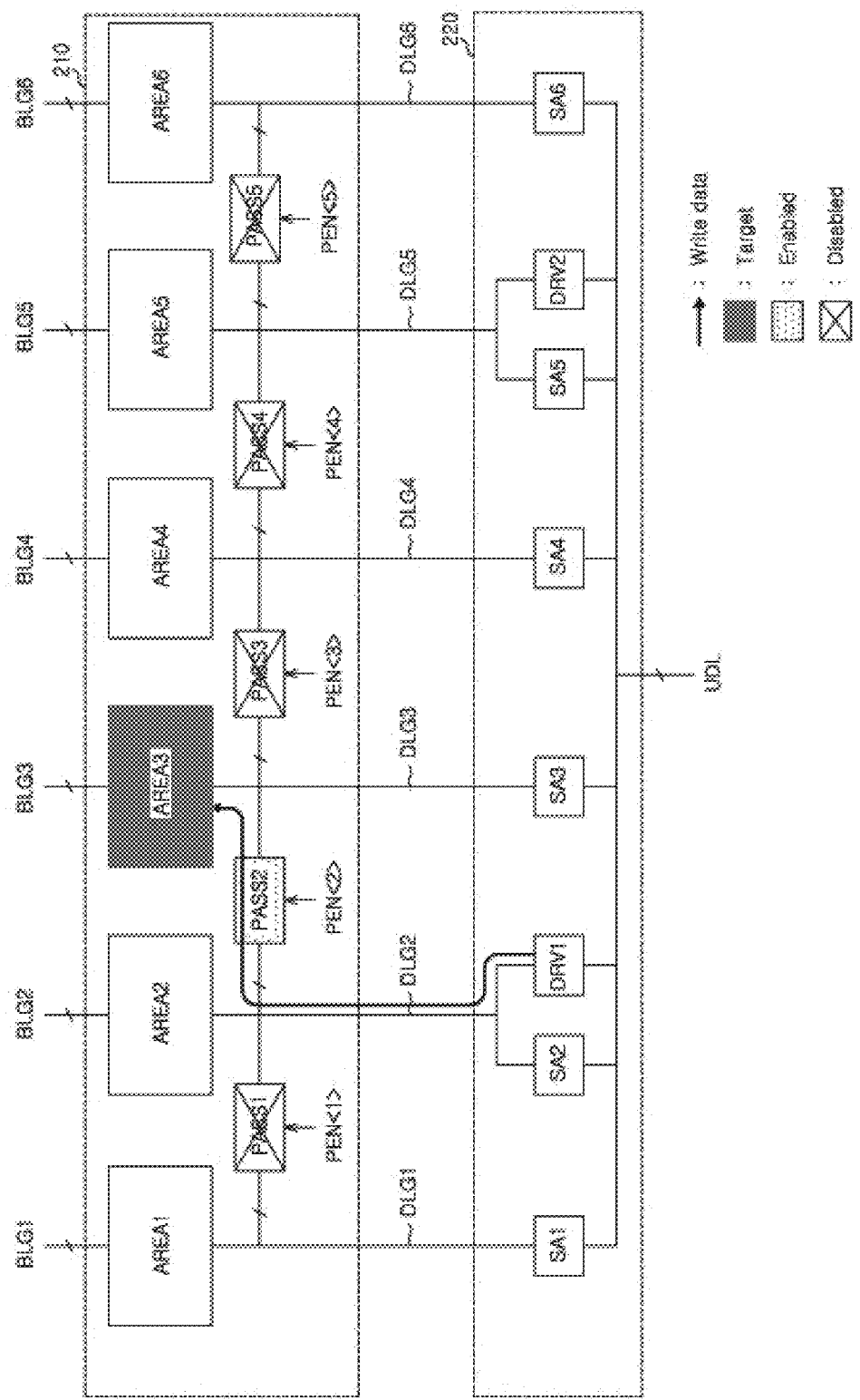
FIG. 9 is an example of a diagram for explaining an operation method of a data transmission circuit for transmitting write data from an input/output unit to a buffer unit.

Referring to FIG. 9, FIG. 9 is an example of a diagram for explaining an operation method of the data transmission circuit 200 for transmitting the write data from the input/output unit 220 to the buffer unit 210. FIG. 9 illustrates an example of a data transmission path when the target buffer area specified by the address AX, for example, is the third buffer area AREA3.

The pass control unit 230 may enable the second pass section PASS2 such that a data transmission path is formed from the first driver DRV to the third buffer area AREA3. The pass control unit 230 may disable the other pass sections PASS1 and PASS3 to PASS5 except for the second pass section PASS2. Consequently, the second and third data line groups DLG2 and DLG3 may be electrically connected to each other, thereby forming the data transmission path. The third buffer area AREA3 may be controlled to receive the write data, transmitted from the first driver DRV1, through the second and third data line groups DLG2 and DLG3.

Figure 10:
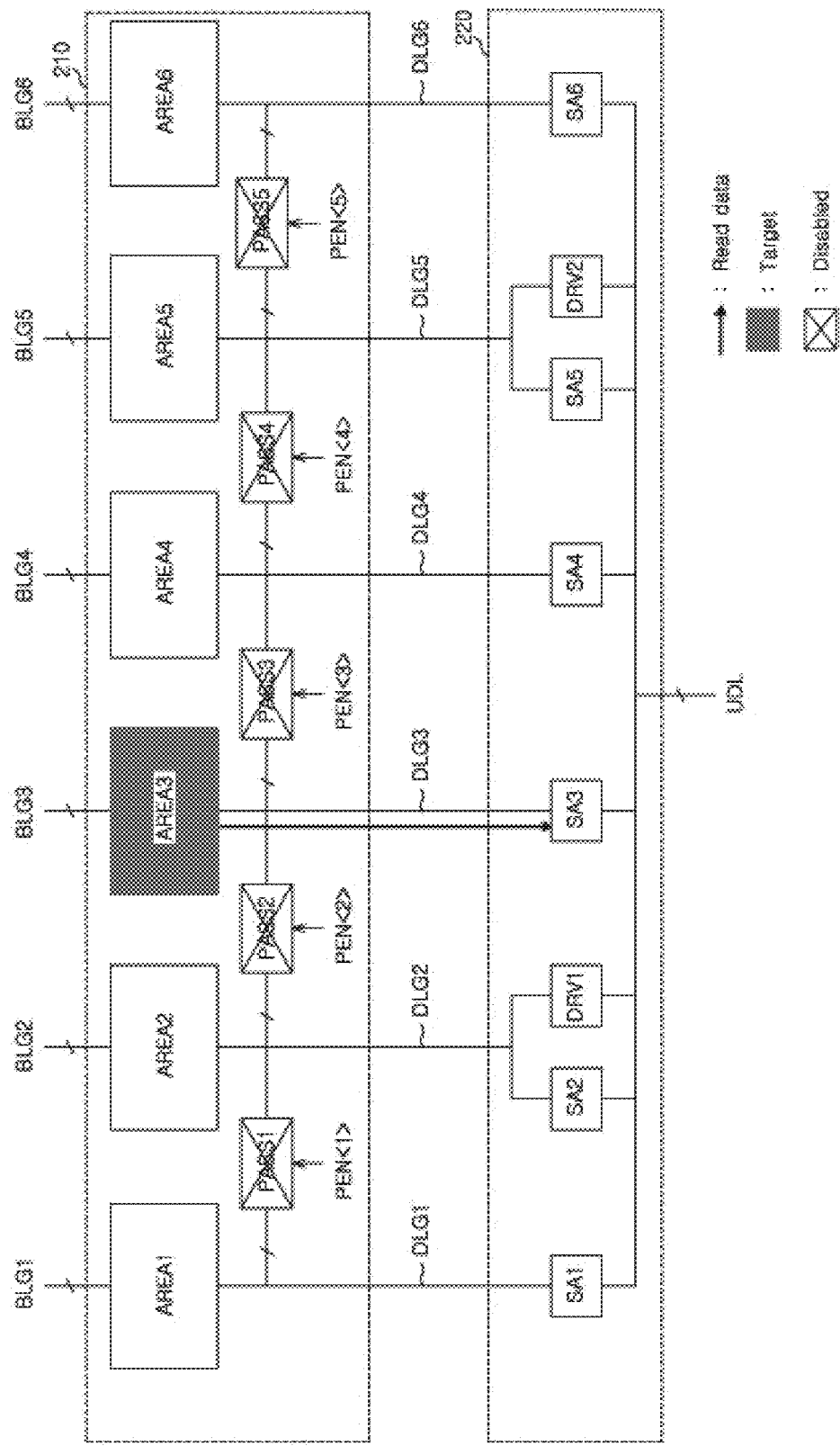
FIG. 10 is an example of a diagram for explaining an operation method of a data transmission circuit for transmitting read data from a buffer unit to an input/output unit.

Referring to FIG. 10, FIG. 10 is an example of a diagram for explaining an operation method of the data transmission circuit 200 for transmitting the read data from the buffer unit 210 to the input/output unit 220. FIG. 10 illustrates an example of a data transmission path when the target buffer area specified by the address AX, for example, is the third buffer area AREA3.

When the read data is transmitted, the pass control unit 230 may disable all the first to fifth pass sections PASS1 to PASS5 similarly to the pass control unit 130 of FIG. 1. Consequently, the first to sixth data line groups DLG1 to DLG6 may be disconnected from one another, so that a data transmission path between the target buffer area and a sense amplifier corresponding to the target buffer area may be limited to the target data line group.

Figure 11:
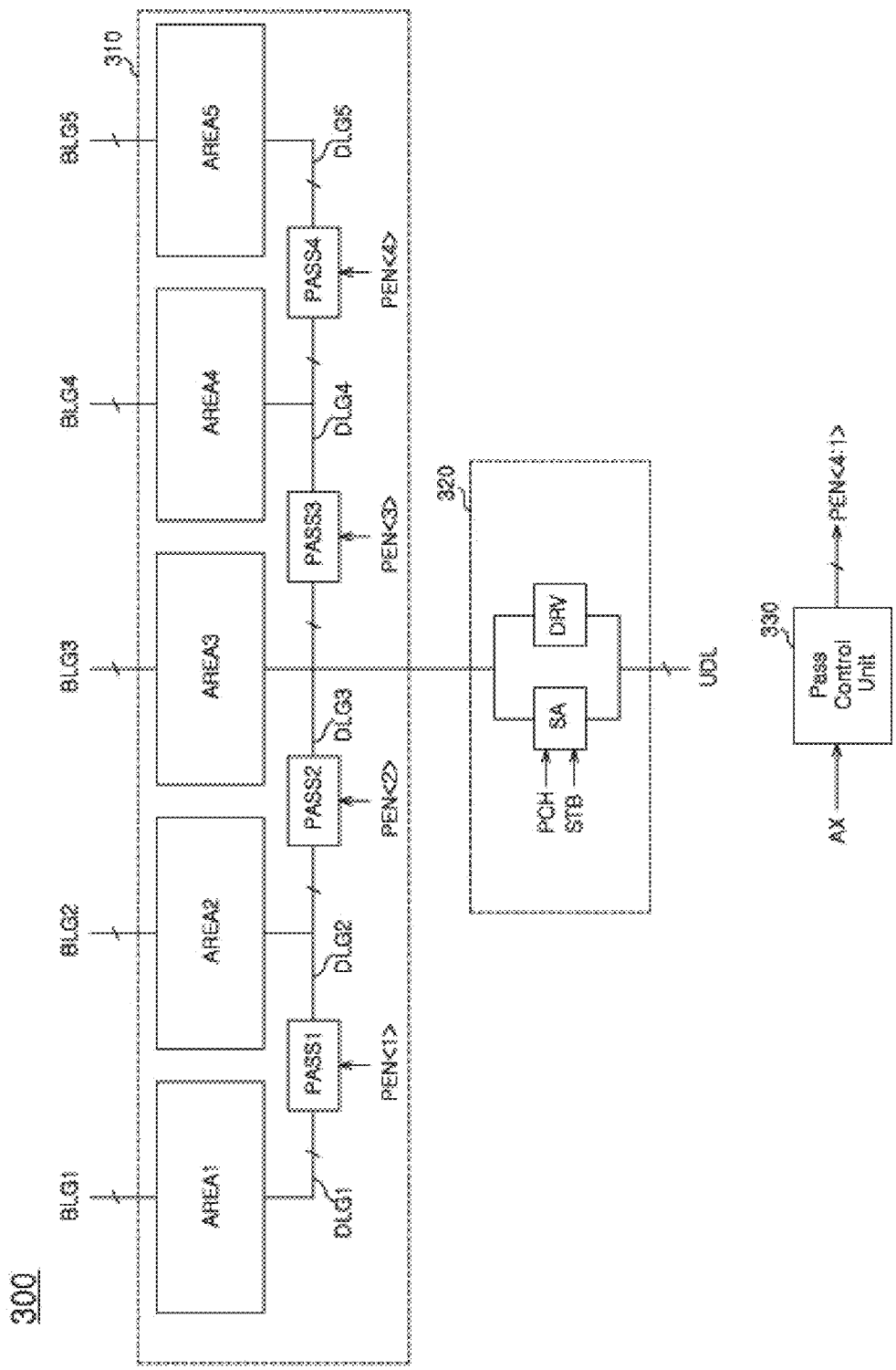
FIG. 11 is a block diagram schematically illustrating a representation of an example of a data transmission circuit according to an embodiment.

Referring to FIG. 11, FIG. 11 is a block diagram schematically illustrating a representation of an example of a data transmission circuit 300 according to an embodiment.

A buffer unit 310 may have configurations and operations substantially similar to those of the buffer unit 110 of FIG. 1.

An input/output unit 320 may include a driver DRV and a sense amplifier SA. The driver DRV may have configurations and operations substantially similar to those of the driver DRV of FIG. 1.

The sense amplifier SA may be coupled to the buffer unit 310 by any one of the first to fifth data line groups DLG1 to DLG5, for example, the third data line group DLG3. The sense amplifier SA may amplify the read data transmitted from the buffer unit 310 and output the amplified data to the upper data line group UDL. The sense amplifier SA may perform a precharge operation in response to a precharge signal PCH. The sense amplifier SA may perform an amplification operation in response to a strobe signal STB.

A pass control unit 330 may receive the address AX for specifying the target buffer area among the first to fifth buffer areas AREA1 to AREA5, and output the first to fourth pass signals PEN1 to PEN4. Similarly to the pass control unit 130 of FIG. 1, the pass control unit 330 may selectively enable the first to fourth pass sections PASS1 to PASS4 in order to optimally form a data transmission path.

The pass control unit 130 of FIG. 1 may disable all the first to fourth pass sections PASS1 to PASS4 when the read data is transmitted, but the pass control unit 330 may selectively enable the first to fourth pass sections PASS1 to PASS4 such that the first to fifth data line groups DLG1 to DLG5 form a proper data transmission path from the target buffer area to the sense amplifier SA when the read data is transmitted, similar to the example in which the write data is transmitted. When the write data or the read data is transmitted, the pass control unit 330 may enable one or more pass sections arranged between the third data line group DLG3 and the target data line group based on the address AX. When the write data or the read data is transmitted, the pass control unit 330 may disable the other pass sections except for the one or more pass sections arranged between the third data line group DLG3 and the target data line group based on the address AX.

Figure 12:
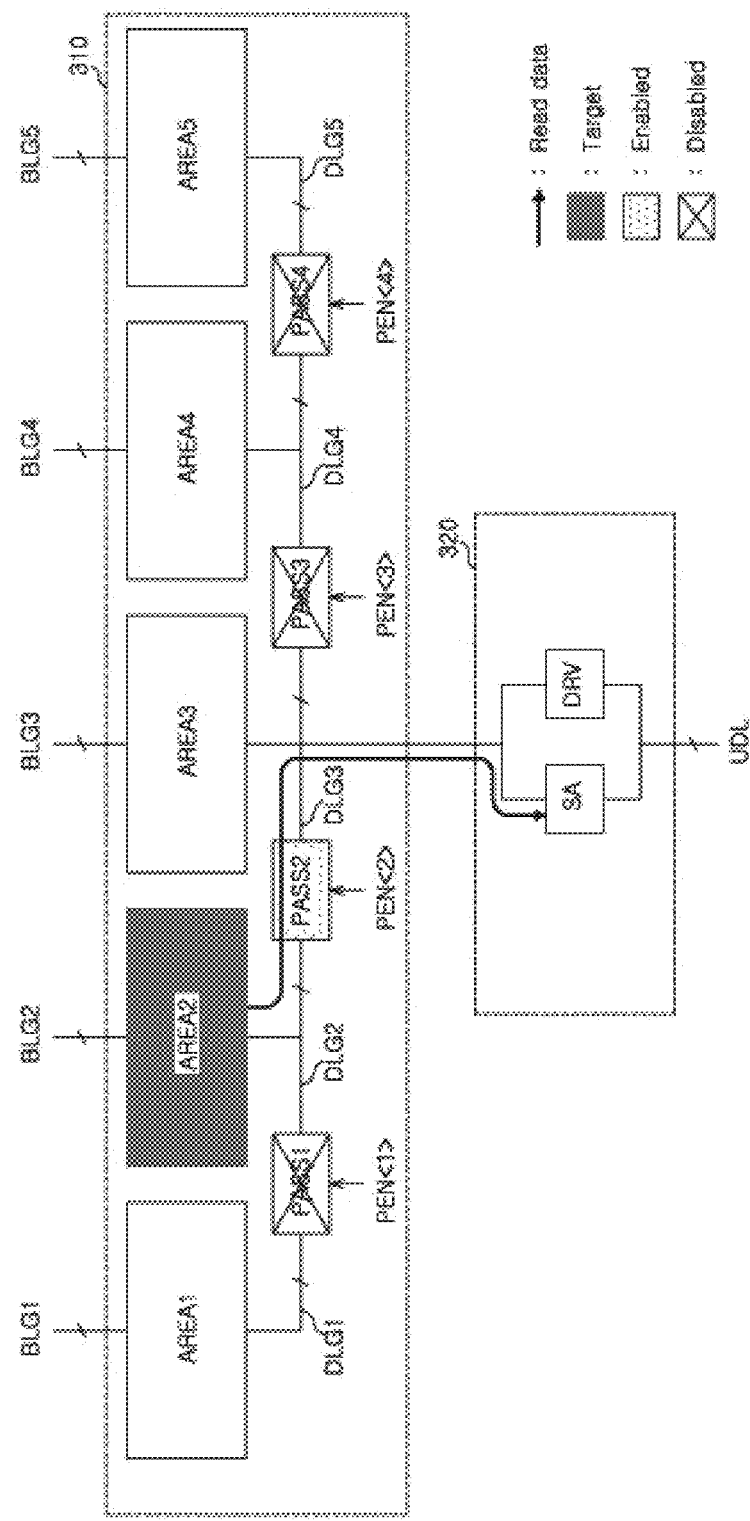
FIG. 12 is an example of a diagram for explaining an operation method of a data transmission circuit for transmitting read data from a buffer unit to an input/output unit.

Referring to FIG. 12, FIG. 12 is an example of a diagram for explaining an operation method of the data transmission circuit 300 for transmitting the read data from the buffer unit 310 to the input/output unit 320. FIG. 12 illustrates an example of a data transmission path when the target buffer area specified by the address AX, for example, is the second buffer area AREA2.

The pass control unit 330 may receive the address AX (that is, "001") corresponding to the second buffer area AREA2. In response to the address AX corresponding to the second buffer area AREA2, the pass control unit 330 may output an enabled second pass signal PEN2 and disabled first, third, and fourth pass signals PEN1, PEN3, and PEN4. Consequently, among the first to fourth pass sections PASS1 to PASS4, only the second pass section PASS2 may be enabled. Consequently, the second and third data line groups DLG2 and DLG3 may be electrically connected to one another, thereby forming a data transmission path. The sense amplifier SA may receive the read data, transmitted from the second buffer area AREA2, through the second and third data line groups DLG2 and DLG3.

In an example, when the target buffer area are buffer areas other than the second buffer area AREA2, the data transmission circuit 300 is to transmit the read data through a data transmission path formed between the target data line group and the third data line group DLG3. An operation method of the data transmission circuit 300 for transmitting the write data may be substantially similar to the operation method of the data transmission circuit 100 of FIG. 1.

Figure 13:
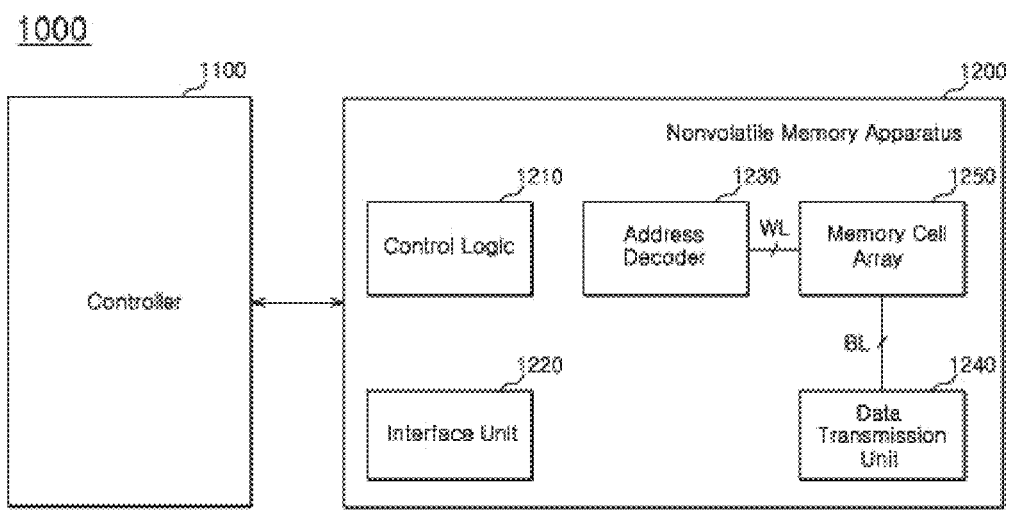
FIG. 13 is a block diagram illustrating an example of a representation of a data storage apparatus including a data transmission unit according to an embodiment.

Referring to FIG. 13, FIG. 13 is a block diagram illustrating an example of a representation of a data storage apparatus 1000 including a data transmission unit 1240 according to an embodiment. The data transmission unit 1240 may be implemented with the aforementioned data transmission circuit and/or circuits 100, 200, and/or 300.

The data storage apparatus 1000 may be configured to store data, provided from an external apparatus, in response to a write request of the external apparatus. The data storage apparatus 1000 may be configured to provide the external apparatus with the stored data in response to a read request of the external apparatus. The external apparatus is an electronic apparatus capable of processing data, and may include a computer, a digital camera, a cellular phone and the like. The data storage apparatus 1000 may be embedded in the external apparatus and may operate, or may be fabricated in a detachable type and may operate when it is coupled to the external apparatus.

The data storage apparatus 1000 may be configured by a PCMCIA (Personal Computer Memory Card International Association) card, a CF (Compact Flash) card, a smart media card, a memory stick, various multimedia cards (MMC, eMMC, RS-MMC, and MMC-micro), an SD (Secure Digital) card (SD, Mini-SD, and Micro-SD), UFS (Universal Flash Storage), a solid state drive and the like.

The data storage apparatus 1000 may include a controller 1100 and a nonvolatile memory apparatus 1200.

The controller 1100 may control a general operation of the data storage apparatus 1000. The controller 1100 may control a write or read operation of the nonvolatile memory apparatus 1200 in response to the write request or the read request of the external apparatus. The controller 1100 may generate a command for controlling the operation of the nonvolatile memory apparatus 1200 and provide the generated command to the nonvolatile memory apparatus 1200.

The nonvolatile memory apparatus 1200 may include a control logic 1210, an interface unit 1220, an address decoder 1230, the data transmission unit 1240, and a memory cell array 1250.

The control logic 1210 may control a general operation of the nonvolatile memory apparatus 1200. The control logic 1210 may control a write, read, or erase operation for the memory cell array 1250 in response to an access command provided from the controller 1100, for example, a write, read, or erase command.

The interface unit 1220 may exchange various control signals including the access command and data with the controller 1100. The interface unit 1220 may transmit various input control signals and data to internal units of the nonvolatile memory apparatus 1200.

The address decoder 1230 may decode row addresses and column addresses. The address decoder 1230 may control word lines WL to be selectively driven according to a decoding result of the row addresses. The address decoder 1230 may control the data transmission unit 1240 such that bit lines BL are selectively driven according to a decoding result of the column addresses.

The data transmission unit 1240 may process data between the interface unit 1220 and the memory cell array 1250. For example, the data transmission unit 1240 may transmit write data to be written to a page corresponding to a decoded address to the memory cell array 1250. The data transmission unit 1240 may transmit read data read from the page corresponding to the decoded address to the interface unit 1220.

The memory cell array 1250 may be coupled to the address decoder 1230 through the word lines WL, and may be coupled to the data transmission unit 1240 through the bit lines BL. The memory cell array 1250, for example, may include a memory cell array with a three-dimensional structure. The memory cell array 1250 may include a plurality of memory cells arranged areas in which the word lines WL and the bit lines BL cross each other. The memory cell array 1250 may include a plurality of memory blocks, wherein each of the memory blocks may include a plurality of pages. The memory block may be a unit by which the erase operation is performed, and the page may be a unit by which the write operation or the read operation is performed.

While certain embodiments have been described above, it will be understood to those skilled in the art that the embodiments described are by way of example only. Accordingly, the data transmission circuit described herein should not be limited based on the described embodiments. Rather, the data transmission circuit described herein should only be limited in light of the claims that follow when taken in conjunction with the above description and accompanying drawings.

What is claimed is:

1. A data transmission circuit comprising:
   data line groups;
   pass sections arranged among the data line groups to allow the data line groups to form one line, such that each pass section electrically connects and disconnects adjacent data line groups when the pass sections are respectively enabled and disabled;
   an input and output (input/output) unit configured to be coupled to the data line groups and to process write data to be transmitted to the data line groups or read data transmitted from the data line groups; and
   a pass control unit configured to selectively enable the pass sections in response to an address for specifying a target data line group of the data line groups,
   wherein the input/output unit comprises a driver configured to be coupled to a driving data line group of data line groups arranged between the pass sections and to transmit the write data to the driving data line group.

2. The data transmission circuit according to claim 1, wherein the pass control unit enables one or more pass sections arranged between the target data line group and the driving data line group of the data line groups.

3. The data transmission circuit according to claim 1, wherein the pass control unit disables pass sections except for the one or more pass sections arranged between the target data line group and a driving data line group of the data line groups.

4. The data transmission circuit according to claim 1, wherein the input/output unit comprises:
   sense amplifiers configured to be respectively coupled to the data line groups and to sense and amplify read data transmitted from a corresponding data line group.

5. The data transmission circuit according to claim 4, wherein the pass control unit disables all the pass sections when the read data is transmitted.

6. The data transmission circuit according to claim 4, further comprising:
   an output control unit configured to control a precharge operation and an amplification operation of each of the sense amplifiers in response to the address.

7. The data transmission circuit according to claim 4, wherein a sense amplifier coupled to the target data line group stops a precharge operation in response to a precharge signal generated based on the address and performs an amplification operation in response to a strobe signal generated based on the address.

8. The data transmission circuit according to claim 4, wherein sense amplifiers coupled to data line groups, except for the target data line group, perform a precharge operation in response to a precharge signal generated based on the address.

9. The data transmission circuit according to claim 1, wherein a first pass section, from the pass sections, comprises:
   a plurality of transistors, each transistor configured to receive a first pass signal, and coupled between corresponding data lines of respective first and second data line groups.

10. The data transmission circuit according to claim 9, wherein each of the transistors of the first pass section electrically connects the corresponding data lines to each other based on enablement of the first pass signal.

11. The data transmission circuit according to claim 9, wherein each of the transistors of the first pass section electrically disconnects the corresponding data lines from each other based on disablement of the first pass signal.

12. A data transmission circuit comprising:
    data line groups;
    pass sections arranged among the data line groups to allow the data line groups to form one line, such that each pass section electrically connects and disconnects adjacent data line groups when the pass sections are respectively enabled and disabled;
    buffer areas configured to be respectively coupled to the data line groups, to receive write data from a corresponding data line group, and to transmit read data to the corresponding data line group; and
    a driver configured to be coupled to a driving data line group of data line groups arranged between the pass sections, and to transmit write data to be transmitted to a target buffer area of the buffer areas to the driving data line group.

13. The data transmission circuit according to claim 12, further comprising:
a pass control unit configured to selectively enable the pass sections in response to an address of the target buffer area allowing for a data transmission path to form from the driver to the target buffer area.

14. The data transmission circuit according to claim 12, wherein at least one pass section arranged between the driving data line group and a data line group coupled to the target buffer area is enabled in response to pass signals generated based on a data input signal enabled when the write data is transmitted.

15. The data transmission circuit according to claim 12, further comprising:
a sense amplifier configured to be coupled to the driving data line group and to sense and amplify read data transmitted from the driving data line group.

16. The data transmission circuit according to claim 15, further comprising:
a pass control unit configured to selectively enable the pass sections in response to an address of the target buffer area allowing for a data transmission path to form from the target buffer area to the sense amplifier.

17. A data transmission circuit comprising:
data line groups;
pass sections arranged among the data line groups to allow the data line groups to form one line, such that each pass section electrically connects and disconnects adjacent data line groups when the pass sections are respectively enabled and disabled;
buffer areas configured to be respectively coupled to the data line groups, to receive write data from a corresponding data line group, and to transmit read data to the corresponding data line group;
sense amplifiers configured to be respectively coupled to the data line groups and to sense and amplify the read data; and
a driver configured to be coupled to a driving data line group of data line groups arranged between the pass sections, and to transmit write data to be transmitted to a target buffer area of the buffer areas to the driving data line group.

18. The data transmission circuit according to claim 17, wherein one or more pass sections, which are coupled to a data line group to which the read data is transmitted, electrically disconnect the data line group to which the read data is transmitted from another data line group.

19. The data transmission circuit according to claim 17, further comprising:
a pass control unit configured to selectively enable the pass sections in response to an address of the target buffer area allowing for a data transmission path to form from the driver to the target buffer area.

20. The data transmission circuit according to claim 17, further comprising:
an output control unit configured to control a precharge operation and an amplification operation of each of the sense amplifiers.

21. The data transmission circuit according to claim 20, wherein the output control unit disables the precharge operation and enables the amplification operation with respect to a sense amplifier corresponding to a target buffer area of the buffer areas in response to an address of the target buffer area.

\* \* \* \* \*